United States Patent
Suzuki et al.

(10) Patent No.: US 10,643,839 B2
(45) Date of Patent: May 5, 2020

(54) FILM FORMING APPARATUS AND FILM FORMING METHOD

(71) Applicant: TOKYO ELECTRON LIMITED, Tokyo (JP)

(72) Inventors: Ayuta Suzuki, Yamanashi (JP); Kosuke Yamamoto, Yamanashi (JP); Kazuyoshi Matsuzaki, Yamanashi (JP); Munehito Kagaya, Yamanashi (JP); Tsuyoshi Moriya, Yamanashi (JP); Tadashi Mitsunari, Yamanashi (JP); Atsushi Kubo, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/835,157

(22) Filed: Dec. 7, 2017

(65) Prior Publication Data

US 2018/0158671 A1    Jun. 7, 2018

(30) Foreign Application Priority Data

Dec. 7, 2016    (JP) .................................. 2016-237886

(51) Int. Cl.
*H01L 21/00*    (2006.01)
*H01L 21/02*    (2006.01)
(Continued)

(52) U.S. Cl.
CPC ........ *H01L 21/0228* (2013.01); *C23C 16/448* (2013.01); *C23C 16/4582* (2013.01); *C23C 16/45525* (2013.01); *C23C 16/45565* (2013.01); *H01L 21/02164* (2013.01); *H01L 21/02211* (2013.01); *H01L 21/02274* (2013.01);
(Continued)

(58) Field of Classification Search
CPC ........... H01L 21/0228; H01L 21/67017; H01L 21/68742; C23C 16/448; C23C 16/45565; C23C 16/4582
See application file for complete search history.

(56) References Cited

U.S. PATENT DOCUMENTS

| 2012/0097330 A1* | 4/2012 | Iyengar ............ C23C 16/45565 156/345.34 |
| 2014/0367359 A1 | 12/2014 | Nakano et al. |
| 2016/0148813 A1 | 5/2016 | Rogers et al. |

FOREIGN PATENT DOCUMENTS

| JP | 2008-508744 | 3/2008 |
| JP | 2008-244140 | 10/2008 |

(Continued)

*Primary Examiner* — Richard A Booth
(74) *Attorney, Agent, or Firm* — Fenwick & West LLP

(57) ABSTRACT

A film forming apparatus includes a gas injection unit having a shower plate provided with gas injection holes, and a plurality of partition regions through which gases are separately injected and which are defined by dividing an arrangement region of the gas injection holes into a plurality of concentric regions in a diametrical direction of the substrate. A supply amount of a raw material gas per unit time in a raw material gas supply period in a cycle of forming a monomolecular layer by supplying the raw material gas and a reactant gas multiple times, and per unit area of the shower plate, and/or a supply amount of the reactant gas per unit time in a reaction period of the raw material gas and the reactant gas in the cycle, and per unit area of the shower plate becomes different in at least two of the partition regions.

20 Claims, 14 Drawing Sheets

(51) Int. Cl.
  *H01L 21/67*    (2006.01)
  *C23C 16/458*   (2006.01)
  *C23C 16/455*   (2006.01)
  *C23C 16/448*   (2006.01)
  *H01L 21/687*   (2006.01)
  *G05D 16/00*    (2006.01)

(52) U.S. Cl.
  CPC .. *H01L 21/67017* (2013.01); *H01L 21/68742* (2013.01); *G05D 16/00* (2013.01)

(56) References Cited

FOREIGN PATENT DOCUMENTS

| | | |
|---|---|---|
| JP | 2016-105466 | 6/2016 |
| KR | 2002-0063140 A | 8/2002 |
| KR | 2015-0062928 A | 6/2015 |
| WO | 2006/020424 | 2/2006 |

\* cited by examiner

FILM FORMING APPARATUS AND FILM FORMING METHOD

CROSS-REFERENCE TO RELATED APPLICATIONS

This application claims priority to Japanese Patent Application No. 2016-237886 filed on Dec. 7, 2016, the entire contents of which are incorporated herein by reference.

FIELD OF THE INVENTION

The disclosure relates to a technique for forming a thin film on a substrate by supplying a raw material gas and a reactant gas.

BACKGROUND OF THE INVENTION

In a semiconductor device manufacturing step, a film forming process is performed on a semiconductor wafer (hereinafter, referred to as "wafer") as a substrate by ALD (Atomic Layer Deposition) using heat energy or a plasma. This film forming process may be performed by using a film forming apparatus for supplying a processing gas to a wafer mounted on a stage serving as a lower electrode from a gas shower plate provided in a processing chamber and serving as an upper electrode and generating a plasma of the processing gas between the gas shower plate and the stage.

In this apparatus, first, a raw material gas is supplied into the processing chamber and adsorbed onto the wafer. Then, a reactant gas is supplied into the processing chamber and activated by a plasma. Active species of the reactant gas and the raw material gas adsorbed onto the wafer react with each other. By repeating a cycle of alternately supplying the raw material gas and the reactant gas multiple times, a thin film having a desired film thickness is formed. In this ALD process, a film thickness profile in a wafer surface may need to be controlled.

U.S. Patent Application Publication No. 2014/0367359 discloses a technique for controlling a film thickness profile in a protruded shape in which a film thickness becomes greater at a central portion than at a peripheral portion of a wafer or in a recessed shape in which the film thickness becomes smaller at the central portion than at the peripheral portion of the wafer by controlling a plasma power or a plasma irradiation time. In this technique, the plasma power is high at a high-plasma density region. When the plasma irradiation time becomes longer, a film quality may be affected and locally changed in the wafer surface. In addition, the effect on a base film may be non-uniform in the wafer surface and damages or degree of oxidation of the base film may be non-uniform in the wafer surface.

Japanese Patent Application Publication No. 2008-244140 discloses a technique for supplying a film forming gas, an oxidizing gas and a purge gas from a central region of a gas shower plate and an oxidizing gas and a purge gas from a peripheral region of the gas shower plate in forming a film by alternately supplying the film forming gas and the oxidizing gas multiple time. In this technique, the film forming gas is supplied only from the central region of the gas shower plate and, thus, it is difficult to control a film thickness profile.

Japanese Patent Application Publication No. 2008-508744 discloses a technique related to a gas distribution injector for chemical vapor deposition reactors. The gas distribution injector has gas inlets arranged in a plurality of concentric regions and a first precursor gas and a second precursor gas having different concentrations are supplied to a central region and a peripheral region. This technique is related to CVD (chemical vapor deposition) and does not control a film thickness profile in ALD.

Japanese Patent Application Publication No. 2016-105466 discloses a shower plate for supplying a gas onto an upper surface of a substrate, the shower plate having a plurality of sectors through which the gas flows for uniformly processing the upper surface of the substrate and being applicable to ALD. However, there is not disclosed a technique for dividing a region through which gases can be separately injected into a plurality of concentric regions and controlling at least one of a raw material gas supply amount and a reactant gas supply amount in ALD to be different in the partition regions.

SUMMARY OF THE INVENTION

In view of the above, the disclosure provides a technique for controlling a film thickness profile in a surface of a substrate.

In accordance with an aspect, there is provided a film forming apparatus for forming a thin film having a predetermined film thickness on a substrate by repeating a cycle of forming a monomolecular layer by supplying a raw material gas and a reactant gas that reacts with the raw material gas multiple times under a vacuum atmosphere. The film forming apparatus includes: a processing chamber in which a mounting portion for mounting thereon a substrate is provided and a vacuum atmosphere is formed; a gas injection unit including a shower plate having a plurality of gas injection holes disposed to face the mounting portion, and a plurality of partition regions through which gases are separately injected and which are defined by dividing an arrangement region of the gas injection holes into a plurality of concentric regions in a diametrical direction of the substrate; a raw material gas supply unit configured to supply a raw material gas to the gas injection unit; a reactant gas supply unit configured to supply a reactant gas to the gas injection unit; and a control unit configured to output a control signal such that at least one of a supply amount of the raw material gas per unit time in a raw material gas supply period in the cycle and per unit area of the shower plate and a supply amount of the reactant gas per unit time in a reaction period of the raw material gas and the reactant gas in the cycle and per unit area of the shower plate becomes different in at least two partition regions among the plurality of partition regions.

In accordance with another aspect, there is provided a film forming method for forming a thin film having a predetermined on a substrate by repeating a cycle of forming a monomolecular layer by suppling a raw material gas and a reactant gas that reacts with the raw material gas multiple times under a vacuum atmosphere. The film forming method includes: forming a thin film on the substrate, by using a gas injection unit including a shower head having a plurality of gas injection holes disposed to face a mounting portion of the substrate and a plurality of partition regions through which gases are separately injected and which are defined by dividing an arrangement region of the gas injection holes into a plurality of concentric regions in a diametrical direction of the substrate, while setting at least one of a supply amount of the raw material gas per unit time in a raw material gas supply period in the cycle and per unit area of the shower plate and a supply amount of the reactant gas per unit time in a reaction period of the raw material gas and the reactant gas in the cycle and per unit area of the shower plate to be different in at least two partition regions among the plurality of partition regions.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
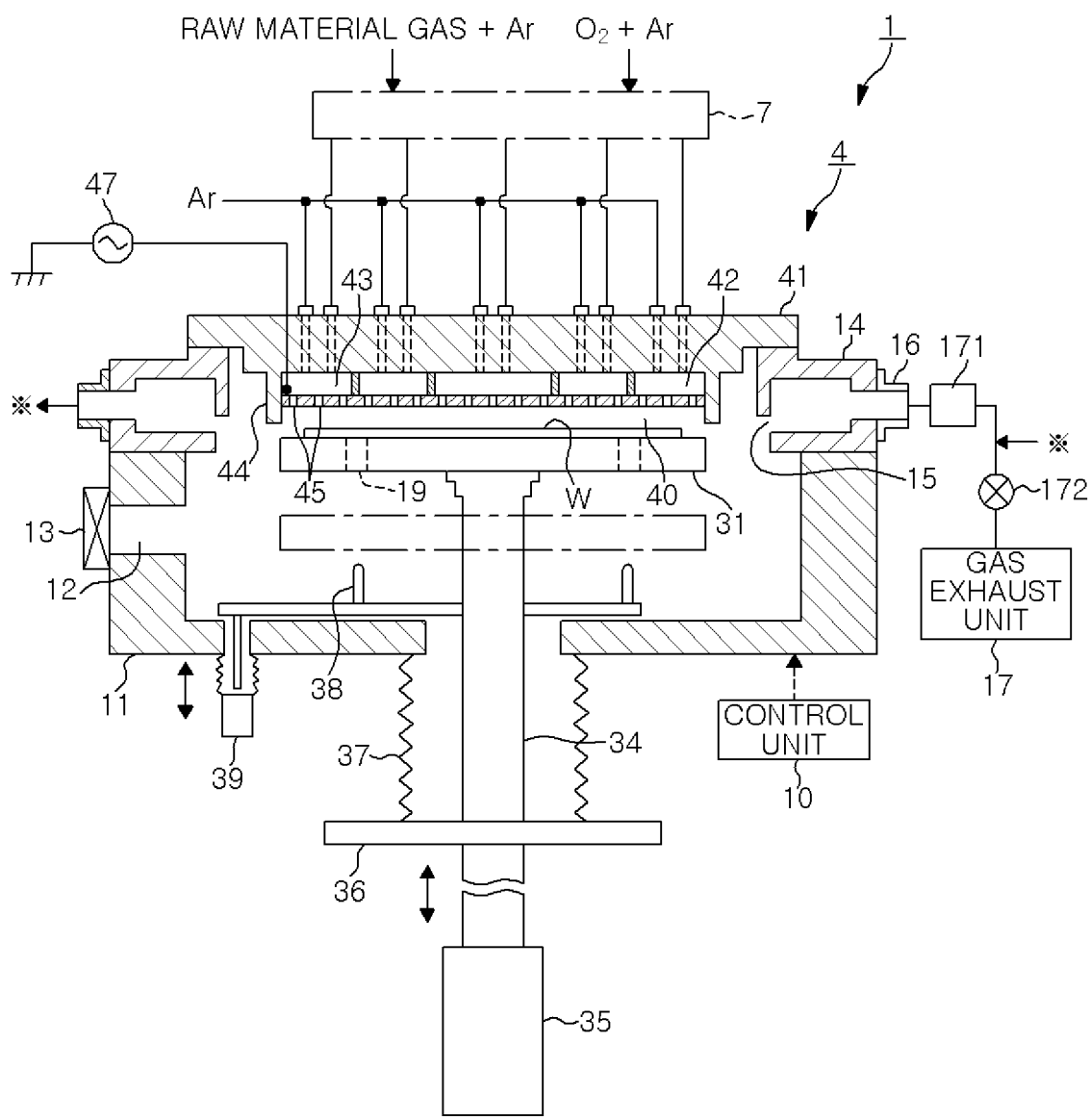
FIG. 1 is a vertical cross sectional view showing a film forming apparatus according to an embodiment.

A film forming apparatus 1 according to an embodiment of the present disclosure will be described with reference to a vertical cross sectional view of FIG. 1. The film forming apparatus 1 includes a processing chamber 11 that is a vacuum chamber where a wafer W is accommodated and processed. The film forming apparatus 1 is configured to form a silicon oxide film on a wafer W by ALD by alternately supplying a raw material gas containing silicon (Si) and an oxidizing gas that is a reactant gas multiple times into the processing chamber 11. As for the raw material gas, it is possible to use, e.g., $Si_2Cl_6$, $Si_2H_6$, HCDS (hexachlorodisilane), TDMAS (tris(dimethylamino)silane), BDEAS (bis(diethyleamino)silane) or the like. As for the oxidizing gas that is a reactant gas, it is possible to use oxygen gas ($O_2$), ozone gas ($O_3$) or the like. The reactant gas, e.g., $O_2$ gas, is turned into a plasma and supplied to the wafer W. The film forming apparatus 1 is configured as a plasma ALD apparatus.

The processing chamber 11 has a substantially flat cylindrical shape. A loading/unloading port 12 for the wafer and a gate valve 13 for opening/closing the loading/unloading port 12 are formed on a sidewall of the processing chamber 11. A gas exhaust duct 14 formed by bending a duct having a square tube-shaped vertical cross section in an annular shape is formed above the loading/unloading port 12. The gas exhaust duct 14 forms a part of the sidewall of the processing chamber 11. A slit-shaped opening 15 extending along a circumferential direction is formed on an inner peripheral surface of the gas exhaust duct 14. The slit-shaped opening 15 serves as a gas exhaust port of the processing chamber 11. One end of a gas exhaust line 16 is connected to the gas exhaust duct 14. The other end of the gas exhaust line 16 is connected to a gas exhaust unit 17 including a vacuum pump via a pressure control unit 171 and a valve 172.

A circular mounting portion 31 for horizontally mounting thereon the wafer W is provided in the processing chamber 11. A heater for heating the wafer W and a grounded electrode plate are buried in the mounting portion 31. The illustration of the heater and the electrode plate is omitted.

An upper end of a supporting member 34 extending in a vertical direction and penetrating through a bottom portion of the processing chamber 11 is connected to a central portion of a bottom surface of the mounting portion 31. A lower end of the supporting member 34 is connected to an elevation unit 35. The mounting portion 31 can be vertically moved between a lower position indicated by a dotted line in FIG. 1 and an upper position indicated by a solid line in FIG. 1 by the elevation unit 35. The lower position is a transfer position at which the wafer W is transferred between the mounting portion 31 and a transfer unit for the wafer W loaded into the processing chamber 11 from the loading/unloading port 12. The upper position is a processing position at which the wafer W is processed.

Reference numerals 36 and 37 in the drawing represent a flange and an extensible/contractible bellows, respectively. Reference numerals 38 and 39 in the drawing represent three supporting pins (only two being shown) and an elevation unit for vertically moving the supporting pins 38, respectively. When the mounting portion 31 is located at the transfer position, the supporting pins 38 are raised through through holes 19 formed in the mounting portion 31 and project from a top surface of the mounting portion 31. Accordingly, the wafer W is transferred between the mounting portion 31 and the transfer unit.

A gas injection unit 4 is provided above the gas exhaust duct 14 to face the wafer W mounted on the mounting portion 31. In this example, the gas injection unit 4 includes a ceiling plate member 41 provided to block an upper opening of the processing chamber 11 and a horizontal disc-shaped shower plate 42 provided below the ceiling plate member 41 to face the mounting portion 31. A flat cylindrical gas diffusion space 43 is formed between the ceiling plate member 41 and the shower plate 42.

In this example, a periphery of the shower plate 42 is supported by an annular protrusion 44 protruding downward from a bottom surface of the ceiling plate member 41. The annular protrusion 44 is formed near the mounting portion 31 located at the processing position. In the shower plate 42, a plurality of gas injection holes 45 opened toward the gas diffusion space 43 is distributed at an inner side of the annular protrusion 44.

Figure 2:
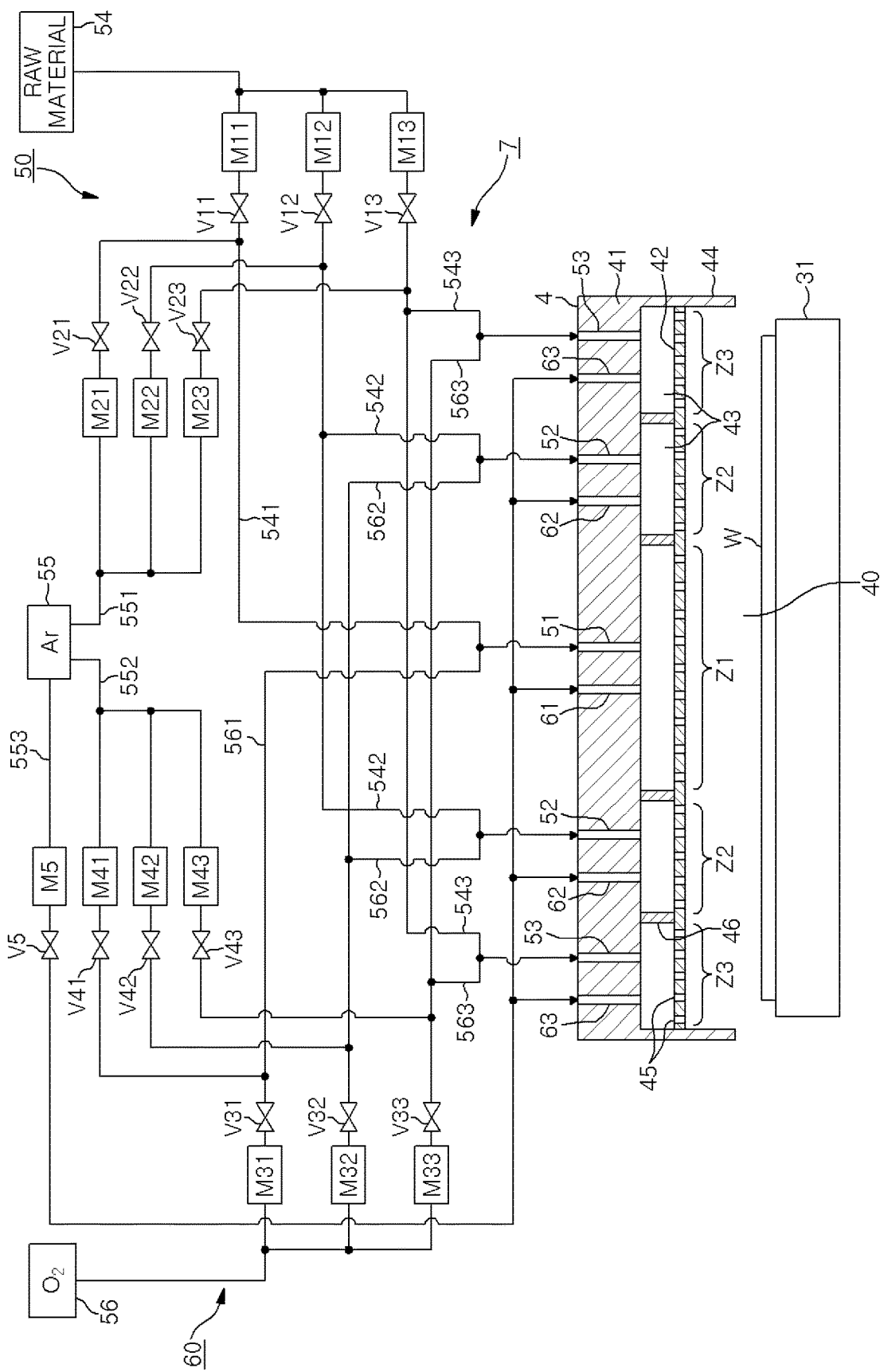
FIG. 2 is a vertical cross sectional view showing an example of a gas injection unit in the film forming apparatus.

As shown in FIG. 2, the gas diffusion space 43 is partitioned into a plurality of, e.g., three, regions by partition walls 46 concentrically arranged in a diametrical direction of the wafer W. Therefore, a plurality of, e.g., three partition regions (first to third partition region Z1 to Z3), is formed in the diametrical direction in the arrangement region of the gas injection holes 45 in the shower plate 42. In this case, the region where the gas diffusion space 43 in the gas injection unit 4 is partitioned is also referred to as a first to a third partition region Z1 to Z3. The first to the third partition region Z1 to Z3 concentrically divide the shower plate 42 formed in a circular shape when seen from the top. The first partition region Z1 is formed in a circular shape. The second and the third partition region Z2 and Z3 are formed in an annular shape. The concentric shape is not limited to a completely concentric shape and may include a substantially concentric shape determined by those skilled in the art and a case in which the second and the third partition region Z2 and Z3 are formed in an annular shape.

The gas injection unit 4 includes a raw material gas supply unit 50 for supplying a raw material gas and a reactant gas supply unit 60 for supplying $O_2$ gas. The raw material gas and the $O_2$ gas are separately supplied to the partition regions Z1 to Z3 of the gas diffusion space 43. In this example, processing gas supply lines 51 to 53 for supplying the raw material gas and the $O_2$ gas to the ceiling plate member 41 of the gas injection unit 4 and gas purge gas supply lines 61 to 63 for supplying a purge gas to the ceiling plate member 41 of the gas injection unit 4 are formed in each of the partition regions Z1 to Z3 of the gas diffusion space 43.

In FIGS. 1 and 2, a single processing gas supply line 51 and a single purge gas supply line 61 are provided in the first partition region Z1, whereas two processing gas supply lines 52 and two purge gas supply lines 62 are provided in the second partition regions Z2 and two processing gas supply lines 53 and two purge gas supply lines 63 are provided in the third partition regions Z3. However, in an actual case, an appropriate number of processing gas supply lines and an appropriate number of purge gas supply lines are provided in each of the first to the third partition region Z1 to Z3.

The raw material gas, $O_2$ gas and Ar gas as a carrier gas are supplied to the processing gas supply lines 51 to 53 via a supply control device 7. As shown in FIG. 2, the supply control device 7 includes supply lines of the raw material gas, the $O_2$ gas and the Ar gas, valves, flow rate control units including mass flow controllers and the like. The processing gas supply lines 51 to 53 are connected to a raw material gas supply source 54 via valves V11 to V13 and flow rate control units M11 to M13 through raw material gas supply lines 541 to 543 and a carrier gas supply line 551, respectively. Further, the processing gas supply lines 51 to 53 are connected to a carrier gas (Ar gas) supply source 55 via valves V21 to V23 and flow rate control units M21 to M23 through the raw material gas supply lines 541 to 543 and the carrier gas supply line 551, respectively.

The processing gas supply lines 51 to 53 are connected to an $O_2$ gas supply source 56 via valves V31 to V33 and flow rate control units M31 to M33 through reactant gas supply lines 561 to 563, respectively. Further, the processing gas supply lines 51 to 53 are connected to the carrier gas (Ar gas) supply source 55 via valves V41 to V43 and flow rate control units M41 to M43 through the reactant gas supply lines 561 to 563 and the carrier gas supply line 552, respectively.

In this example, the processing gas supply lines 51 to 53, the raw material gas supply lines 541 to 543, the valves V11 to V13, the flow rate control units M11 to M13 and the raw material gas supply source 54 constitute a raw material gas supply unit 50. Further, the processing gas supply lines 51 to 53, the reactant gas supply lines 561 to 563, valves V31 to V33, the flow rate control units M31 to M33, and the $O_2$ gas supply source 56 constitute the reactant gas supply unit 60.

The purge gas supply lines 61 to 63 are joined and connected to the Ar gas supply source 55 via the valve V5 and the mass flow controller M5 through a supply line 553. The operations of the valves and the flow rate control units are controlled by a control unit 10 to be described later.

Accordingly, the raw material gas, $O_2$ gas, Ar gas as a carrier gas, and Ar gas as a purge gas are supplied to the first to the third partition region Z1 to Z3 of the gas injection unit 4. These gases are injected toward the wafer W from the same gas injection holes 45 in the first to the third partition region Z1 to Z3.

Referring back to FIG. 1, a space surrounded by the bottom surface of the shower plate 42, the annular protrusion 44 and the top surface of the mounting portion 31 serves as a processing space 40 where the film forming process is performed. The shower plate 42 forms a pair with an electrode plate (not shown) of the mounting portion 31. The shower plate 43 serves as an electrode plate for generating a capacitively coupled plasma (CCP) in the processing space 40. A high frequency power supply 47 is connected to the shower plate 42 via a matching unit (not shown). The CCP is generated by supplying a high frequency power from the high frequency power supply 47 to the gas supplied into the processing space 40 through the shower plate 42. The shower plate 42, the electrode plate and the high frequency power supply 47 constitute a plasma generation unit. The high frequency power supply 47 may be connected to the electrode plate of the mounting portion 31 instead of being connected to the shower plate 42. In that case, the shower plate 42 may be grounded.

The film forming apparatus 1 includes a control unit 10 that is a computer. The control unit 10 includes a data processing unit having a program, a memory and a CPU, or the like. The program has commands for sending control signals from the control unit 10 to the respective components of the film forming apparatus 1 and performing a film forming process to be described later. Specifically, the program controls opening/closing timing of the valves, on/off timing of the high frequency power supply 47, and the like. Further, the program allows the heater 32 to control a temperature of the wafer W. The program is stored in a storage medium, e.g., a compact disk, a hard disk, an MO (magneto-optical disk) or the like, and installed in the control unit 10.

The control unit 10 is configured to output a control signal such that the raw material gas supply amount in the raw material gas supply period and the $O_2$ gas supply amount in the $O_2$ gas supply period become different in the first to the third partition region Z1 to Z3. Further, the control unit 10 is configured to output a control signal such that a relationship combination pattern of the raw material gas supply amount in the first to the third partition region Z1 to Z3 becomes the same as that of the $O_2$ gas supply amount in the first to the third partition region Z1 to Z3. The raw material gas supply amount or the $O_2$ gas supply amount indicate the supply amount of the raw material gas or the $O_2$ gas per unit time and per unit area of the shower plate 42 which is injected through the gas injection holes 45 of the first to the third partition region Z1 to Z3. Hereinafter, the raw material gas supply amount indicates the supply amount per unit time and per unit area of the shower plate 42. The $O_2$ gas supply amount indicates the supply amount per unit time and per unit area of the shower plate 42.

In this example, as will be described later, a recipe for a film forming process includes a first step and a second step in order to form a thin film having a desired film thickness on the wafer W. Therefore, the control unit 10 is configured to output a control signal such that a ratio of the raw material gas supply amount between the three partition regions Z1 to Z3 and a ratio of the $O_2$ gas supply amount between the three partition regions Z1 to Z3 become different in the first step and the second step. Further, the control unit 10 is configured to output a control signal such that the relationship combination pattern of the raw material gas supply amount in the three partition regions Z1 to Z3 and that of the $O_2$ gas supply amount in the three partition regions Z1 to Z3 become different in the first step and the second step.

Figure 3:
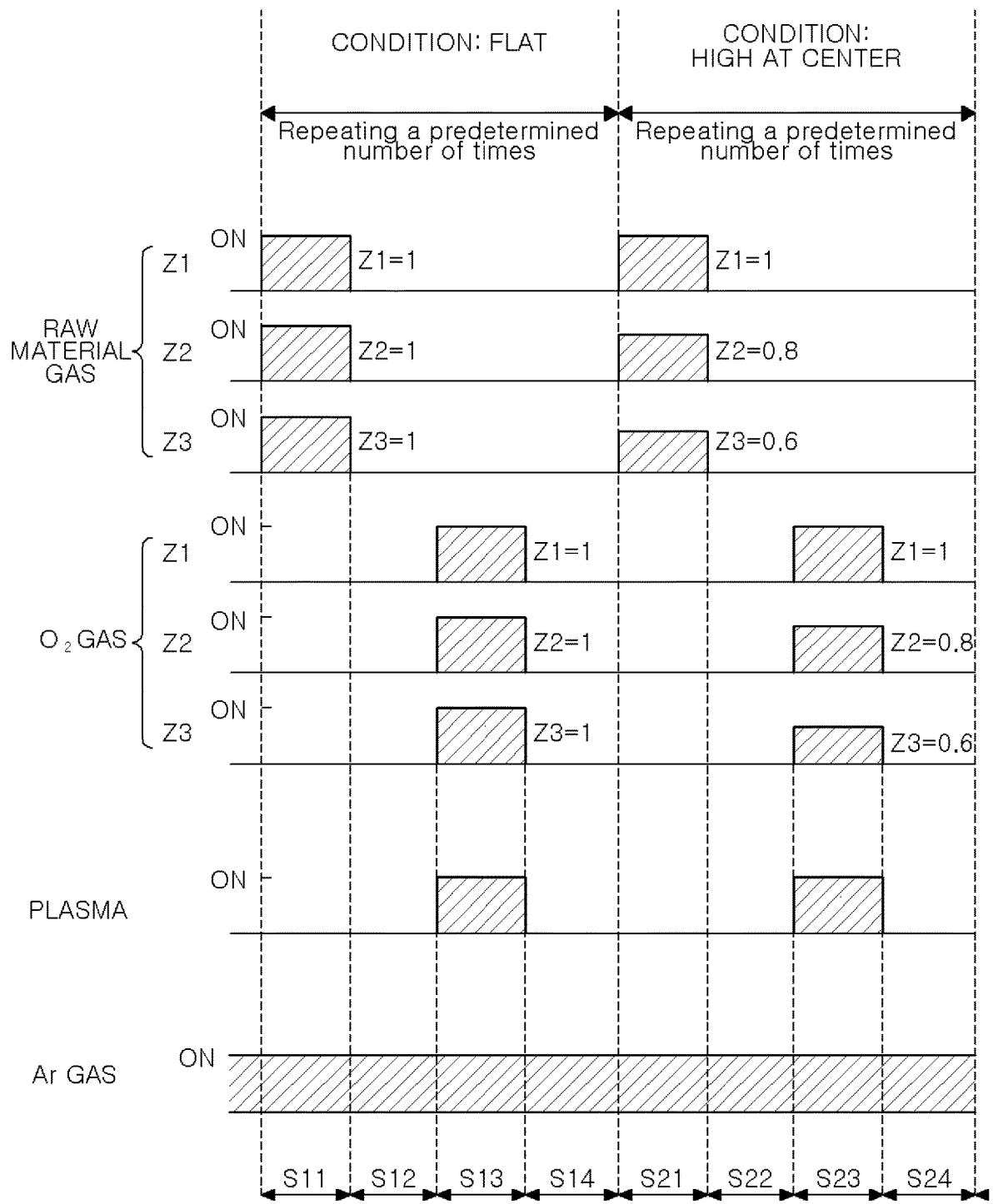
FIG. 3 is a chart for explaining a film forming method performed by the film forming apparatus.

Next, an example of the film forming method of the present disclosure which is performed by the film forming apparatus 1 will be described with reference to FIGS. 3 to 6. The film forming method of this embodiment includes a first step and a second step as steps of forming an $SiO_2$ film having a desired film thickness on the wafer W. The first step and the second step have different film forming conditions. In this example, the first step is performed under a film forming condition (condition "flat") for obtaining a flat film thickness profile by making the film thickness uniform in the wafer surface. The second step is performed under a film forming condition (condition "high at center") for obtaining a film thickness profile in which a film thickness is greater at a central portion than at a peripheral portion of the wafer. The chart in FIG. 3 shows timing of start and stop of supply of various gases into the processing chamber 11 and on/off timing of the high frequency power supply 47 (plasma).

In order to supply the raw material gas to the wafer W, the valves V11 to V13 for supplying the raw material gas are opened. Accordingly, the raw material gas from the raw material gas supply source 54 is supplied to the first to the third partition region Z1 to Z3 of the gas diffusion space 43 through the first to the third raw material gas supply lines 541 to 543 and the first to the third processing gas supply lines 51 to 53, respectively. The raw material gas is injected to the processing space 40 through the gas injection holes 45 formed in the first to the third partition region Z1 to Z3 of the shower plate 42.

In order to supply $O_2$ gas to the wafer W, the valves V31 to V33 for supplying $O_2$ gas are opened. Accordingly, the $O_2$ gas is supplied from the $O_2$ gas supply source 56 to the processing space 40 through the first to the third reactant gas supply lines 561 to 563, the first to the third processing gas supply lines 51 to 53, and the gas injection holes 45 of the first to the third partition region Z1 to Z3 of the gas diffusion space 43.

In order to supply Ar gas as a carrier gas to the wafer W, the valves V21 to V23 and the valves V41 to V43 for supplying Ar gas are opened. Accordingly, the Ar gas from the Ar gas supply source 55 is supplied to the processing space 40 through the carrier gas supply lines 551 and 552, the first to the third raw material gas supply lines 541 to 543, the first to the third reactant gas supply lines 561 to 563, the first to the third processing gas supply lines 51 to 53, and the gas injection holes 45 of the first to the third partition region Z1 to Z3.

First, the first step is performed. The gate valve 13 is opened in a state where the processing chamber 11 is set to a predetermined vacuum atmosphere, and the wafer W is transferred from a transfer chamber in a vacuum atmosphere, which is adjacent to the processing chamber 11, onto the mounting portion 31 located at the transfer position, by a transfer unit. When the wafer W is transferred to the mounting portion 31 by vertical movement of the supporting pins 38, the transfer unit is retreated from the processing chamber 11. Then, the gate valve 13 is closed and the mounting portion 31 is raised to the processing position. As a consequence, the processing space 40 is generated. The wafer W is heated to a predetermined temperature by the heater in the mounting portion 31.

Next, the valves V21 to V23 and V41 to V43 for supplying Ar gas are opened and Ar gas is supplied from the Ar gas supply source 55 to the processing space 40 as described above. Then, the valves V11 to V13 for supplying a raw material gas are opened. As described above, the raw material gas is injected from the raw material gas supply source 54 to the processing space 40 through the gas injection holes 45 of the first to the third partition region Z1 to Z3 and raw material gas molecules (material containing silicon atoms as a silicon precursor) are adsorbed onto the wafer W (step S11). In this case, the raw material gas supply amount is the same in the first to the third partition region Z1 to Z3. In FIG. 3, a ratio of the raw material gas supply amount between the partition regions Z1 to Z3 is expressed by Z1=1, Z2=1 and Z3=1.

Next, the valves V11 to V13 are closed and the supply of the raw material gas to the wafer W is stopped. The supply of the Ar gas is continued and the raw material gas remaining in the processing space 40 without being adsorbed onto the wafer W is purged by Ar gas (step S12).

Then, the valves V31 to V33 for supplying a reactant gas are opened. As described above, the reactant gas is supplied from the reactant gas supply source 56 to the processing space 40 through the gas injection holes 45 of the first to the third partition region Z1 to Z3 and the high frequency power supply 47 is switched on. At this time, the $O_2$ gas supply amount is the same in the partition regions Z1 to Z3. In FIG. 3, a ratio of the $O_2$ gas between the partition region Z1 to Z3 is expressed by Z1=1, Z2=1 and Z3=1. Therefore, the $O_2$ gas in the processing space 40 is converted into a plasma and the raw material gas adsorbed onto the wafer W is oxidized by the plasma. Accordingly, a layer of silicon oxide is formed as a reaction product (step S13). Since the raw material gas and the reactant gas react with each other by the plasma, the plasma generation period coincides with the reaction period of the raw material gas and the reactant gas. However, in this example, the plasma is generated at the timing of supplying the reactant gas and, thus, the reactant gas supply period becomes the reaction period.

Next, the high frequency power supply 47 is switched off and the valves V31 to V33 are closed to stop the generation of the plasma in the processing space 40 and the supply of the $O_2$ gas. The supply of the Ar gas is continued and the $O_2$ gas remaining in the processing space 40 and inactivated active species of the plasma are purged by the Ar gas and removed from the processing space 40 (step S14).

Thereafter, the valves V11 to V13 for supplying the raw material gas are opened. As described above, the raw material gas is supplied to the wafer W and the step S11 is performed. Next, the steps S12 to S14 are performed. By repeating a film forming cycle of the steps S11 to S14 a predetermined number of times, a silicon oxide film is laminated on the surface of the wafer W under the film forming condition "flat". Accordingly, an $SiO_2$ film having a predetermined film thickness is formed.

Figure 4:
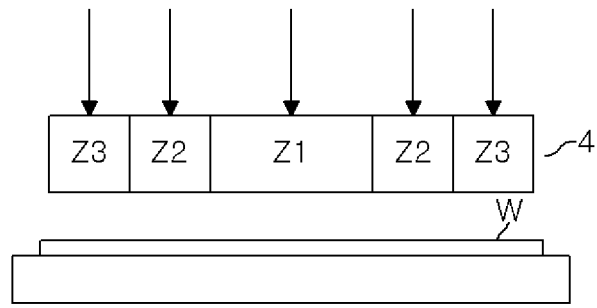
FIGS. 4 and 5 explain the film forming method performed by the film forming apparatus.
Figure 5:
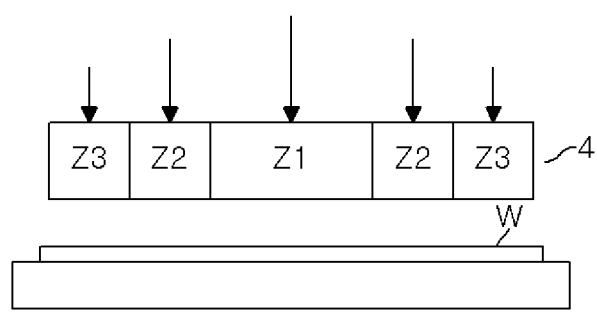

In the first step, the raw material gas supply amount in the raw material gas supply period in one cycle and the $O_2$ gas supply amount in the $O_2$ gas supply period in one cycle are set to be same in the three partition regions Z1 to Z3. Therefore, as shown in FIG. 4, the raw material gas and the $O_2$ gas are injected at the same flow rate from the first to the third partition region Z1 to Z3. Accordingly, a silicon oxide layer is substantially uniformly laminated on the wafer surface, thereby forming an $SiO_2$ film having a flat film thickness profile. In this specification, the same supply amount indicates that the supply amount of the raw material gas per unit time and per unit area of the shower plate 42 is the same. The same supply amount may not be the completely same supply amount and may include a case where the supply amount is determined to be substantially the same by those skilled in the art.

Next, a second step is performed. First, the valves V11 to V13 for raw material gas supply are opened. As described above, the raw material gas from the raw material gas supply source 54 is injected into the processing space 40 through the gas injection holes 45 of the first to the third partition region Z1 to Z3 and adsorbed onto the wafer W (step S21). At this time, the raw material gas supply amount is set to be greatest in the first partition region Z1 corresponding to the central portion of the wafer W and to be gradually decreased toward the third partition region Z3 corresponding to the peripheral portion of the wafer W.

In this example, the raw material gas supply amount is changed by controlling a partial pressure. In the film forming apparatus shown in FIGS. 1 and 2, when the partial pressure is changed, the flow rate of the raw material gas supplied to the first to the third partition region Z1 to Z3 is changed in a state where the concentration of the raw material gas and the flow rate of the carrier gas are set to be same in the first to the third partition region Z1 to Z3 and, thus, the flow rate of the raw material gas injected through the gas injection holes 45 of the first to the third partition region Z1 to Z3 is changed. In FIG. 3, the ratio of the raw material gas supply amount between the partition regions Z1 to Z3 is expressed by Z1=1, Z2=0.8 and Z3=0.6.

Next, the valves V11 to V13 are closed and the supply of the raw material gas is stopped. The supply of the Ar gas is continued to purge the raw material gas remaining in the processing space 40 (step S22). The raw material gas supply unit 50 is configured to supply a gaseous mixture of the raw material gas and Ar gas as a carrier gas during the raw material gas supply period and to continue the supply of the Ar gas during a period other than the raw material gas supply period. Accordingly, the backflow of the $O_2$ gas or the raw material gas to the first to the third processing gas supply lines 51 to 53, the first to the third raw material gas supply lines 541 to 543, and the first to the third reactant gas supply lines 561 to 563 is prevented.

Next, the valves V31 to V33 for supplying the reactant gas are opened. As described above, the reactant gas from the reactant gas supply source 56 is injected to the processing space 40 through the gas injection holes 45 of the first to the third partition region Z1 to Z3, and the high frequency power supply 47 is switched on. At this time, the $O_2$ gas supply amount is set to be greatest at the central portion of the wafer W and decreased toward the peripheral portion of the wafer W, as in the case of the raw material gas. Further, the $O_2$ gas supply amount is adjusted by changing the partial pressure of the $O_2$ gas, as in the case of the raw material gas. In FIG. 3, the ratio of the $O_2$ gas supply amount between the first to the third partition region Z1 to Z3 is expressed by Z1=1, Z2=0.8 and Z3=0.6. Accordingly, the $O_2$ gas in the processing space 40 is turned into a plasma and the raw material gas adsorbed onto the wafer W is oxidized. As a consequence, a silicon oxide film is formed as a reaction product (step S23).

Next, the high frequency power supply 47 is switched off and the valves V31 to V33 are closed to stop the generation of the plasma in the processing space 40 and the supply of the $O_2$ gas. The supply of the Ar gas is continued to purge inactivated active species of the plasma and the $O_2$ gas remaining in the processing space 40 and remove them from the processing space 40 (step S24). The reactant gas supply unit 60 is configured to supply a gaseous mixture of $O_2$ gas and Ar gas as a carrier gas during the $O_2$ gas reaction period (supply period) and continue the supply of the Ar gas during a period other than the $O_2$ gas reaction period. Accordingly, the backflow of the $O_2$ gas or the raw material gas to the first to the third processing gas supply lines 51 to 53, the first to the third raw material gas supply lines 541 to 543, and the first to the third reactant gas supply lines 561 to 563 is prevented.

Next, the valves V11 to V13 for supplying the raw material gas are opened. As described above, the raw material gas is supplied to the wafer W and the step S21 is performed. Then, the steps S22 to S24 are performed. By repeating a film forming cycle of the steps S21 to S24 a predetermined number of time, a silicon oxide film is laminated on the surface of the wafer W under the film forming condition "high at center". As a consequence, an $SiO_2$ film having a predetermined film thickness is formed.

When the steps S21 to S24 are repeated the predetermined number of times, the mounting portion 31 is lowered and the wafer W is unloaded from the processing chamber 11 in the reverse order of the process of loading the wafer W into the processing chamber 11. Then, the film forming process is completed.

In the second step, the raw material gas supply amount in the raw material gas supply period in one cycle and the $O_2$ gas supply amount in the $O_2$ gas supply period in one cycle are set to be different in the first to the third partition region Z1 to Z3. Accordingly, the supply amounts of the raw material gas and the $O_2$ gas are greatest at the central portion of the wafer W and gradually decreased toward the peripheral portion of the wafer W, as can be seen from FIG. 5. In other words, the supply amounts are decreased in the order of the first partition region Z1 corresponding to the central portion→the second partition region Z2 corresponding to an intermediate portion between the central portion and the peripheral portion in the diametrical direction→the third partition region Z3 corresponding to the peripheral portion. As a result, the film thickness of the $SiO_2$ film becomes greater at the central portion than at the peripheral portion in the wafer surface, and an $SiO_2$ film having a film thickness profile "high at center" is formed.

Figure 6:
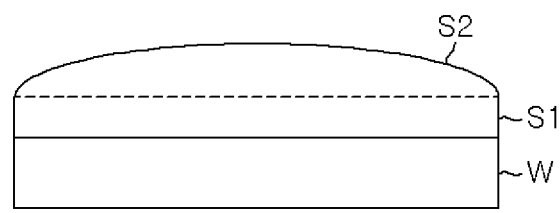
FIG. 6 is a side view showing a thin film formed by the film forming apparatus.

As shown in FIG. 6, the $SiO_2$ film is formed by forming an $SiO_2$ film having a flat film thickness profile on the wafer W by the first step and then forming thereon an $SiO_2$ film S2 having a film thickness profile "high at center" by the second step.

Figure 7:
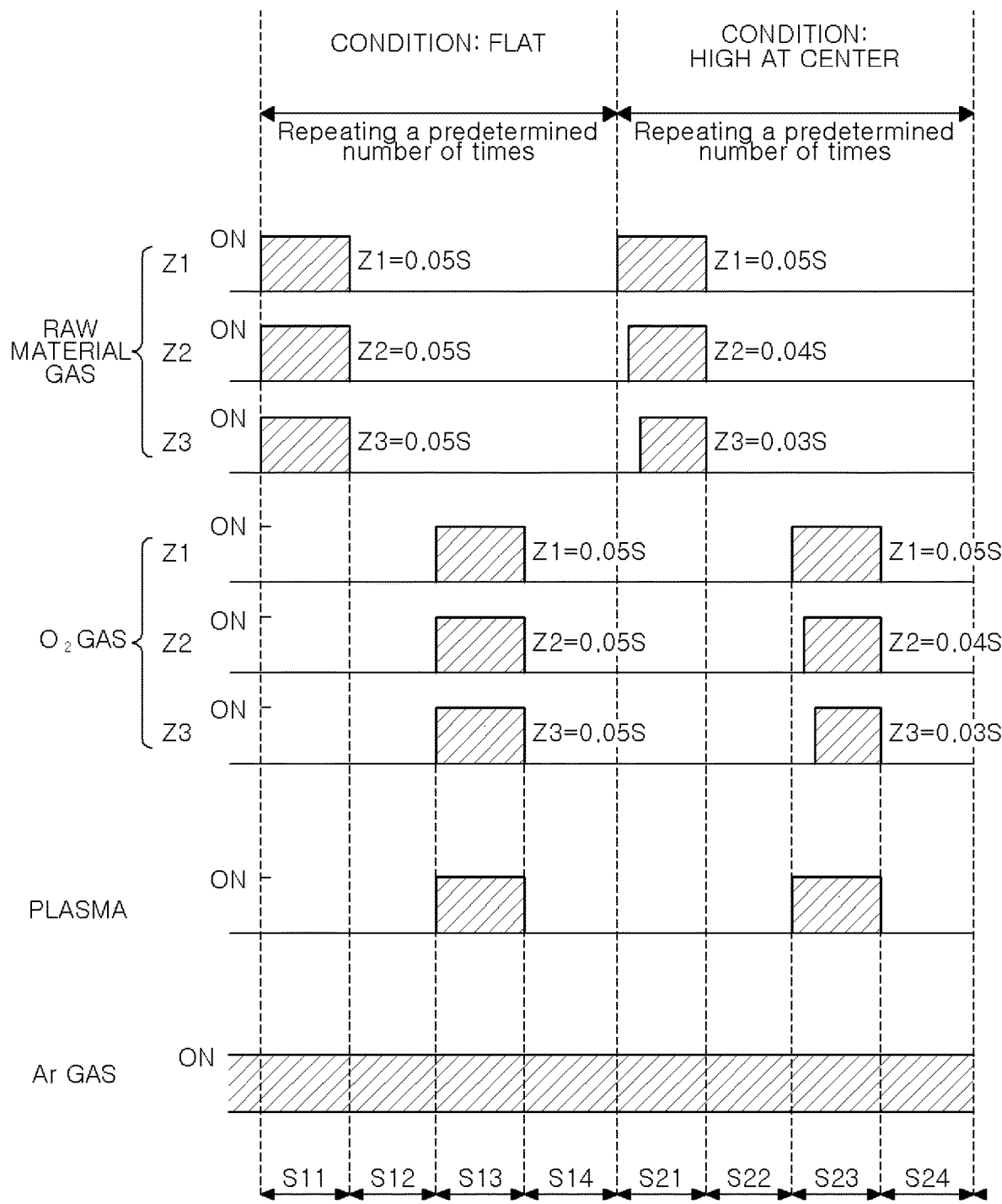
FIG. 7 is a chart showing another example of the film forming method performed by the film forming apparatus.

As can be seen from the chart of FIG. 7, the supply amount of the raw material gas per unit time and per unit area of the shower plate 42 and the supply amount of the $O_2$ gas per unit time and per unit area of the shower plate 42 may be changed by changing the supply period of the raw material gas and that of the $O_2$ gas in a state where the raw material gas and the $O_2$ gas have the same flow rate and the same concentration. In the first step, in the step S11 of supplying the raw material gas and in the step S13 of supplying the $O_2$ gas, the supply periods of the raw material gas and the $O_2$ gas in the three partition regions Z1 to Z3 are set to be equal, e.g., 0.05 second.

In the second step, in order to obtain the film thickness profile "high at center", in the step S21 of supplying the raw material gas and in the step S23 of supplying the $O_2$ gas, the supply period of the raw material gas and the $O_2$ gas are set to be longest in the first partition region Z1 corresponding to the central portion and to be gradually decreased toward the third partition region Z3 corresponding to the peripheral portion. Specific supply periods of the raw material gas and the $O_2$ gas in the steps S21 and S23 are, e.g., 0.05 second in the first partition region Z1, 0.04 second in the second partition region Z2 and 0.03 second in the third partition region Z3. In this example, the timing of starting injection is changed such that the timing of stopping injection of the raw material gas and the O₂ gas in the partition regions Z1 to Z3 becomes the same.

By changing the supply periods of the raw material gas and the O₂ gas, the amount of the raw material gas and the O₂ gas supplied to the wafer W is changed. Therefore, the film thickness is increased in the region where the supply period is long and decreased in the region where the supply period is short. In this manner, the film thickness profile can be controlled.

The supply amount of the raw material gas per unit time and per unit area of the shower plate 42 and the supply amount of the reactant gas per unit time and per unit area of the shower plate 42 may be changed by changing a gas concentration (ratio of the flow rate of the raw material gas to a total flow rate of the raw material gas and the carrier gas or ratio of the flow rate of the raw material gas to the flow rate of the carrier gas) while setting the flow rates of the raw material gas and the reactant gas to be the same. When the partial pressure is controlled to change the supply amount, it is possible to change the flow rate of the raw material gas (O₂ gas) while maintaining the flow rate of the carrier gas as described above or it is possible to change the flow rates of both of the raw material gas (O₂ gas) and the carrier gas.

In the above, the control unit 10 outputs a control signal such that at least one of the supply amount of the raw material gas in the raw material gas supply period and the O₂ gas supply amount in the O₂ gas supply period becomes different in the first to the third partition region Z1 to Z3. Therefore, when the film forming process is performed under, e.g., the condition "high at center", the raw material gas may be different in the first to the third partition regions Z1 to Z3 by setting the supply amount of the raw material gas, e.g., a partial pressure or the supply period, as shown in FIG. 3 or 7 and and the O₂ gas may be uniformly injected from the entire surface of the gas injection unit 4 by setting the partial pressure or the supply period of the O₂ gas to be same in the partition regions Z1 to Z3. In that case, the O₂ gas supply amount in the film forming process, which is easily affected by the flow rate distribution, is set to be same in the first to the third partition region Z1 to Z3. Accordingly, the film thickness can be controlled precisely.

The raw material gas supply amount may be controlled to be same in the first to the third partition region Z1 to Z3 and the O₂ gas supply amount may be controlled to be different in at least two partition regions among the first to the third partition region Z1 to Z3. Since the SiO₂ film is formed by reaction between the raw material gas and the O₂ gas, a desired film thickness profile can be obtained by controlling the film thickness by changing the O₂ gas supply amount.

Figure 8:
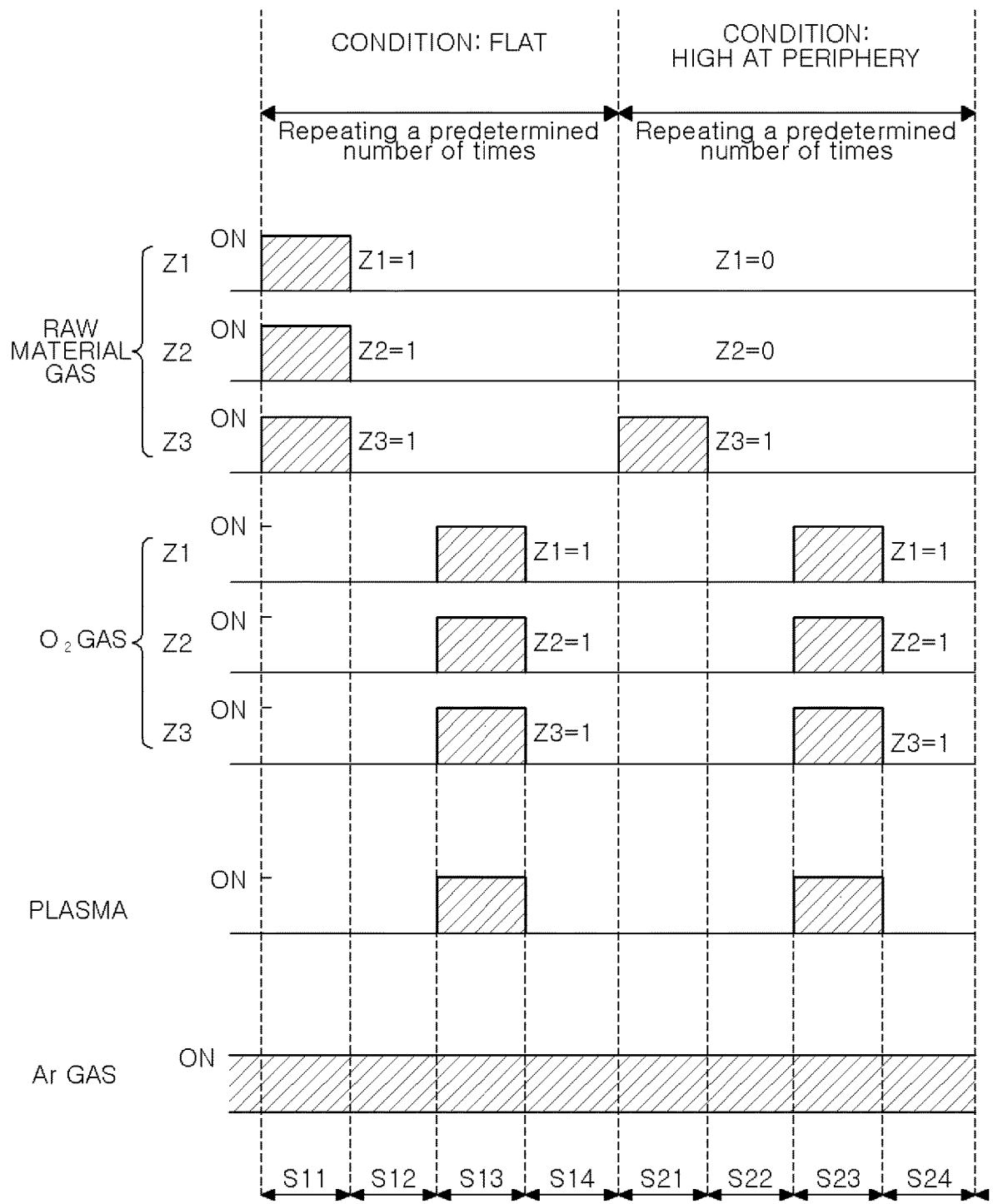
FIG. 8 is a chart showing still another example of the film forming method performed by the film forming apparatus.

The supply amount of the raw material gas and that of the reactant gas per unit time and per unit area of the shower plate 42 may be zero. In that case, a case in which the film thickness is greater at the peripheral portion of the wafer than at the central portion of the wafer, i.e., a case in which a film thickness profile "high at periphery" is obtained, will be described as an example with reference to the chart of FIG. 8.

Figure 9:
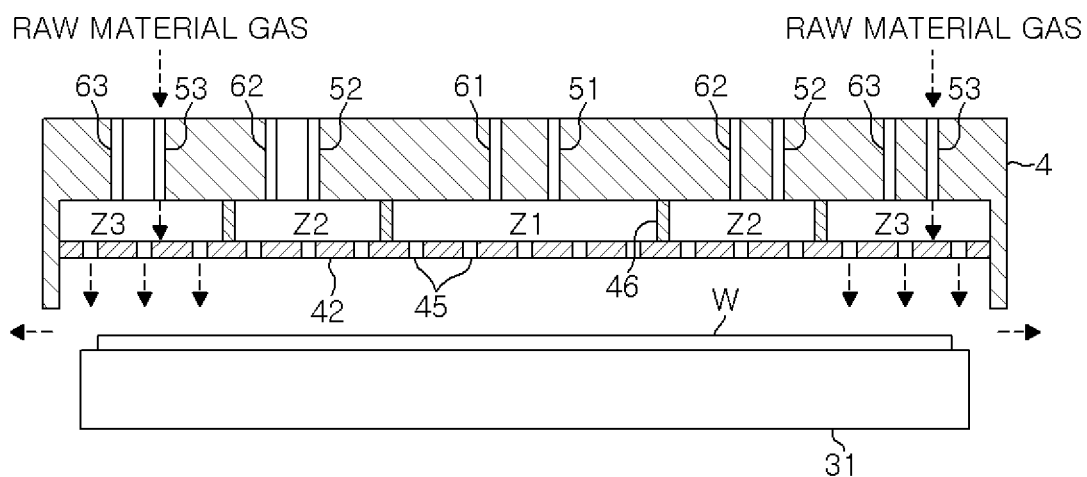
FIGS. 9 and 10 explain a gas supply state in the film forming apparatus.

In this example, the supply amount of the raw material gas and that of the reactant gas are controlled by changing a partial pressure. Since the first step in this example is the same as that in the above embodiment, the description thereof will be omitted. The second step is performed under the film forming condition "high at periphery". In the step S21 of supplying the raw material gas, in order to obtain the film thickness profile "high at periphery", the supply amount of the raw material gas in the first and the second partition region Z1 and Z2 is set to zero and the raw material gas is supplied only to the third processing gas supply line 53 of the third partition region Z3. Accordingly, as shown in FIG. 9, the raw material gas is injected only through the gas injection holes 45 of the third partition region Z3 of the gas injection unit 4 which corresponds to the peripheral portion. As a consequence, the raw material gas is supplied to the peripheral portion of the wafer W and molecules of the raw material gas are adsorbed thereonto.

Figure 10:
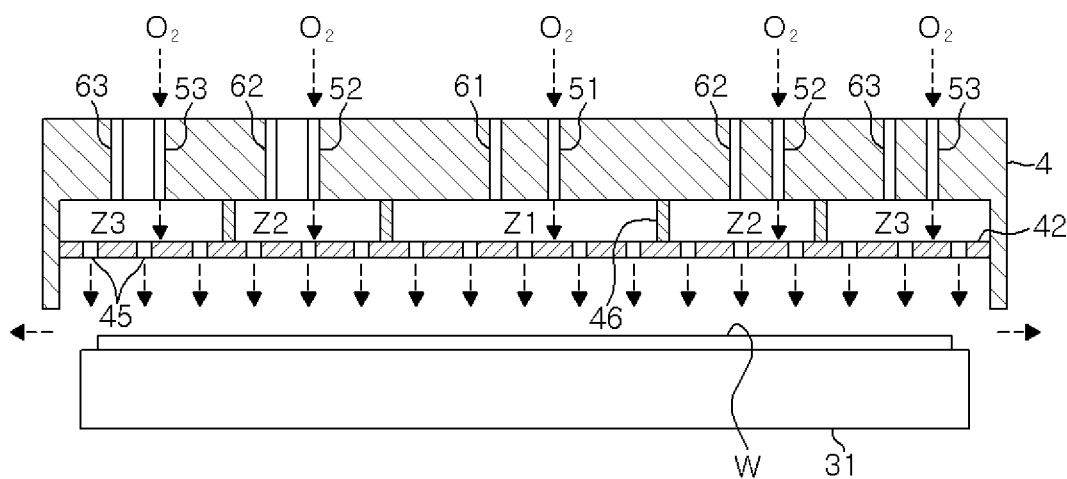

In the step S23 of supplying O₂ gas, the O₂ gas is supplied at the same flow rate to the first to the third processing gas supply lines 51 to 53 of all the partition regions Z1 to Z3. Accordingly, as shown in FIG. 10, the O₂ gas is injected from all the partition regions Z1 to Z3 of the gas injection unit 4 and a plasma of O₂ is generated on the entire surface of the wafer W. The molecules of the raw material gas which are adsorbed onto the peripheral portion of the wafer W are oxidized and an SiO₂ film is formed on the peripheral portion of the wafer W. As a result, the SiO₂ film having a film thickness profile "high at periphery" can be formed.

Figure 11B:
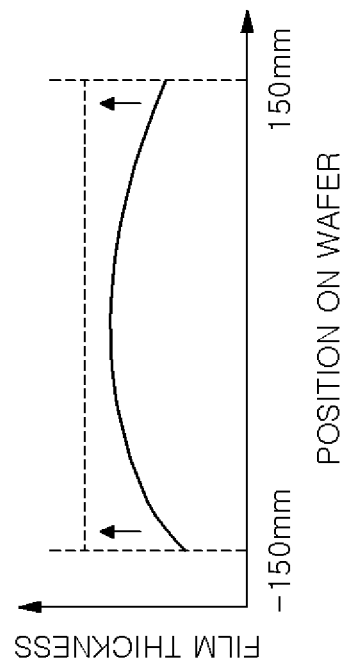
FIGS. 11A and 11B views for explaining another example of the film forming method performed by the film forming apparatus.
Figure 11A:
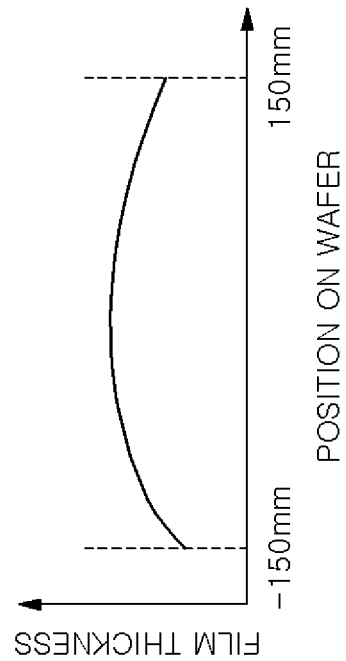

In the film forming apparatus 1, before a film forming process is performed on a product wafer, a film forming process is performed on a test wafer under preset conditions. Accordingly, a state of a formed film is monitored and the film forming conditions may be corrected when it is deviated from a tolerable range of a desired film thickness profile. For example, a case in which a uniform film thickness profile is desired will be described with reference to FIG. 11. In FIG. 11A, a measured film thickness profile and film forming conditions at the time of starting the film formation are schematically illustrated. In FIG. 11B, a corrected image of the film thickness profile and the film forming conditions after the correction are illustrated.

First, the above-described ALD cycle is performed on a test wafer while setting the supply amount ratio of the raw material gas and that of the O₂ gas to be same between the first to the third partition region Z1 to Z3 (Z1=1, Z2=1, Z3=1) at the time of starting the film formation in order to obtain a uniform film thickness profile. When a half or less of the total ALD cycle is completed, e.g., when 50 cycles were completed on the assumption that the total cycle is 150 cycles, the test wafer is unloaded from the processing chamber 11 and a film thickness profile of the formed SiO₂ film is measured by a film thickness detector (not shown).

The obtained film thickness profile is compared with the desired film thickness profile. When the measured film thickness profile is within the tolerable range of the desired profile, the film forming process of the remaining cycles is performed without correcting the film forming condition. When the measured film thickness profile is deviated from the tolerable range of the desired profile, the film forming conditions are corrected and the film forming process of the remaining cycles is performed under the corrected film forming conditions.

As can be seen from FIG. 11A, in the profile in which the film thickness is smaller at the peripheral portion, the supply amount ratio of the raw material gas and that of the O₂ gas are corrected such that the supply amount becomes greatest at the third partition region Z3 corresponding to the peripheral portion and smallest at the first partition region Z1 corresponding to the central portion, e.g., such that the supply amount ratio becomes Z1=0.5, Z2=0.75 and Z3=1. In the profile in which the film thickness is smaller at the central portion, the supply amount ratio of the raw material gas and that of the O₂ gas are corrected such that the supply amount becomes greatest in the first partition region Z1 corresponding to the central portion. By performing the film forming process of the remaining 100 cycles under the corrected film forming conditions, the amount of the SiO$_2$ film formed at the peripheral portion is increased. When the predicted number of cycles is completed, the test wafer is unloaded from the processing chamber 11 and the film thickness profile of the formed SiO$_2$ film is measured by a film thickness detector (not shown).

The obtained film thickness profile is compared with the desired film thickness profile. When the measured film thickness profile is within the tolerable range of the desired profile, the film forming process is performed on a product wafer under optimized film forming conditions. In this example, until 50 cycles, the ALD cycle is performed while setting the supply amount ratio of the raw material gas and that of the O$_2$ gas to be same between the first to the third partition region Z1 to Z3 (first step). In the remaining cycles, the ALD cycle is performed under the corrected film forming conditions (second step). When the measured film thickness profile is deviated from the tolerable range of the desired profile, the film forming conditions are corrected again.

In this embodiment, in forming an SiO$_2$ film on the wafer W by repeating the cycle of alternately supplying the raw material gas and the reactant gas (O$_2$ gas) multiple times, the gases are injected from the gas injection unit 4 having the first to the third partition region Z1 to Z3 through which the gases can be separately injected, the first to the third partition region Z1 to Z3 being concentric regions arranged in the diametrical direction of the wafer W. At least one of the supply amount of the raw material gas per unit time and per unit area of the shower plate 42 and the supply amount of the O$_2$ gas per unit time and per unit area of the shower plate 42 is controlled to be different in at least two partition regions among the first to the third partition region Z1 to Z3. Therefore, the film thickness in the diametrical direction of the wafer W can be adjusted and the film thickness profile can be controlled.

The film thickness profile control improves the in-plane uniformity in an etching process to be performed later. For example, in the etching process, the etching rate may be higher at the central portion than at the peripheral portion of the wafer. At this time, in the film forming process, the in-plane uniformity of the etching process can be improved by forming an SiO$_2$ film having a film thickness profile in which the film thickness is greater at the central portion of the wafer. Since the film forming process can be performed instead of correcting the etching process recipe, the degree of freedom of the semiconductor manufacturing process can be increased, which is effective.

In the above embodiment, the raw material gas and the O$_2$ gas are injected through the same gas injection holes 45 in the surface of the wafer W in the first to the third partition region Z1 to Z3. Therefore, the supply pattern of the raw material gas and that of the O$_2$ gas in the surface of the wafer W becomes the same, which makes it possible to easily control the film thickness profile.

In the above embodiment, the first step of obtaining a uniform film thickness profile and the second step of varying the film thickness in the surface of the wafer W are performed. Therefore, the film thickness profile can be controlled in a state where the effect on the film quality or on the base is suppressed. For example, the target having a small film thickness is subjected to film formation for obtaining the film thickness profile "high at center" under the same condition from the start to the completion of the film formation, the peripheral portion where the film thickness is small is easily affected by the plasma and the film quality or the base may be changed locally. Accordingly, both of a uniform film quality and a desired film thickness profile can be obtained by performing a process of forming a thin film having a uniform film thickness in the surface and then controlling the film thickness. As a result, it is particularly effective in a process of forming a thin film having a small film thickness, in which the difference between a central portion and a peripheral portion is, for example, a few cycles and high process controllability is required.

In the second step, the raw material gas supply amount and the O$_2$ gas supply amount are controlled in the first to the third partition region Z1 to Z3, and the relationship combination pattern of the raw material gas supply amount in the first to the third partition region Z1 to Z3 is the same as that of the O$_2$ gas supply amount in the first to the third partition region Z1 to Z3. Therefore, the raw material gas is sufficiently adsorbed onto a portion where the film needs to be formed and, also, the O$_2$ gas can be sufficiently supplied only to that portion. In addition, the oxidation of the base film at a portion where film formation is not required can be suppressed.

In the film forming apparatus, even when the film formation is performed under the same film forming condition, the film thickness profile may vary due to a difference in an assembly accuracy or a dimensional accuracy of components. Therefore, in the case of performing the film forming process when starting up the apparatus or after maintenance of the apparatus, the film forming process is performed on a test wafer under preset film forming conditions and, then, the film forming conditions may be corrected when the film thickness profile of the formed SiO$_2$ film is deviated from the tolerable range of the desired film thickness profile. Accordingly, a product wafer is subjected to the film forming process under the corrected film forming conditions, which makes it possible to ensure a desired film thickness profile. As a result, even when the difference in the film thickness profile is caused due to the difference in the assembly accuracy or the dimensional accuracy of the components in the film forming apparatus, the difference can be easily corrected by reducing the number of steps, the processing time or the like, compared to the case of controlling the film forming apparatus.

Next, another example of the gas injection unit will be described with reference to FIG. 12. As in the above embodiment, the gas injection unit 8 in this example has the shower plate 42 in which the gas injection holes 45 are formed to face the mounting portion 31 and the first to the third partition region Z1 to Z3 formed by dividing the arrangement region of the gas injection holes 45 into a plurality of, e.g., there, concentric regions in the diametrical direction of the wafer W, through which gases can be separately injected. The gas injection unit of this example is different from the aforementioned gas injection unit 4 in that, instead of the gas exhaust duct 14 and the opening 15 shown in FIG. 1, gas exhaust passageways 81 to 83 are respectively formed in the ceiling plate member 41 for the first to the third partition region Z1 to Z3 to communicate with the processing space 40 and the gases in the processing space 40 are exhausted through the gas exhaust passageways 81 to 83.

The gas exhaust passageways 81 to 83 are connected to a gas exhaust line 84. The other end of the gas exhaust line 84 is connected to a gas exhaust unit 85 including a vacuum pump via a pressure control unit 851 and a valve 852. Therefore, the gases in the processing space 40 are exhausted upwardly. Like reference numerals will be given to like parts as those of the gas injection unit 4 shown in FIG. 1, such as the first to the third processing gas supply lines 51 to 53, the first to the third purge gas supply lines 61 to 63 and the like, and redundant description thereof will be omitted.

In the gas injection unit 8, the raw material gas, the $O_2$ gas and the Ar gas are supplied to the first to the third partition region Z1 to Z3, and the gases in the processing space 4 are exhausted upwardly. In this manner, the same film forming process as that described above is performed. The supply amount of the raw material gas and that of the $O_2$ gas per unit time and per unit area of the shower plate 42 may be changed by controlling a partial pressure or a supply period. Further, in a state where it is configured that the gas exhaust amount in each of the first to the third partition region Z1 to Z3 can be controlled, the supply amount of the raw material gas and that of the $O_2$ gas may be changed by controlling the gas exhaust amount in each of the partition regions Z1 to Z3 while setting a partial pressure or a supply period of the raw material gas and the $O_2$ gas to be same in all the partition regions Z1 to Z3.

As described above, in the present disclosure, at least one of the supply amount of the raw material gas per unit time and per unit area of the shower plate 42 and the supply amount of the $O_2$ gas per unit time and per unit area of the shower plate becomes different in at least two partition regions among the three partition regions Z1 to Z3. A desired film thickness profile may have any shape among a "high at center" shape in which a film thickness is greatest at the central portion of the wafer W, a "high in the middle" shape in which the film thickness is greatest at an intermediate portion between the central portion and the peripheral portion of the wafer W, a "high at periphery" shape in which the film thickness is greatest at the peripheral portion of the wafer W and the like. In order to obtain a desired film thickness profile, a third step may be performed after the first step and the second step. For example, in the first step, the film may be formed with a uniform film thickness. In the second step, the film may be formed with the "high at center" profile. In the third step, the film may be formed with a uniform thickness.

The present disclosure may be applied to a case in which a plasma is generated by reaction between a raw material gas and a reactant gas ($O_2$ gas) while constantly supplying the reactant gas along with Ar gas in the film forming apparatus. For example, in the film forming apparatus shown in FIG. 1, the control unit 10 is configured to output a control signal such that a reactant gas is injected from the gas injection unit 4 during a cycle of forming a monomolecular layer and the supply amount of the raw material gas in the raw material gas supply period becomes different in at least two partition regions among the first to the third partition region Z1 to Z3.

Figure 13:
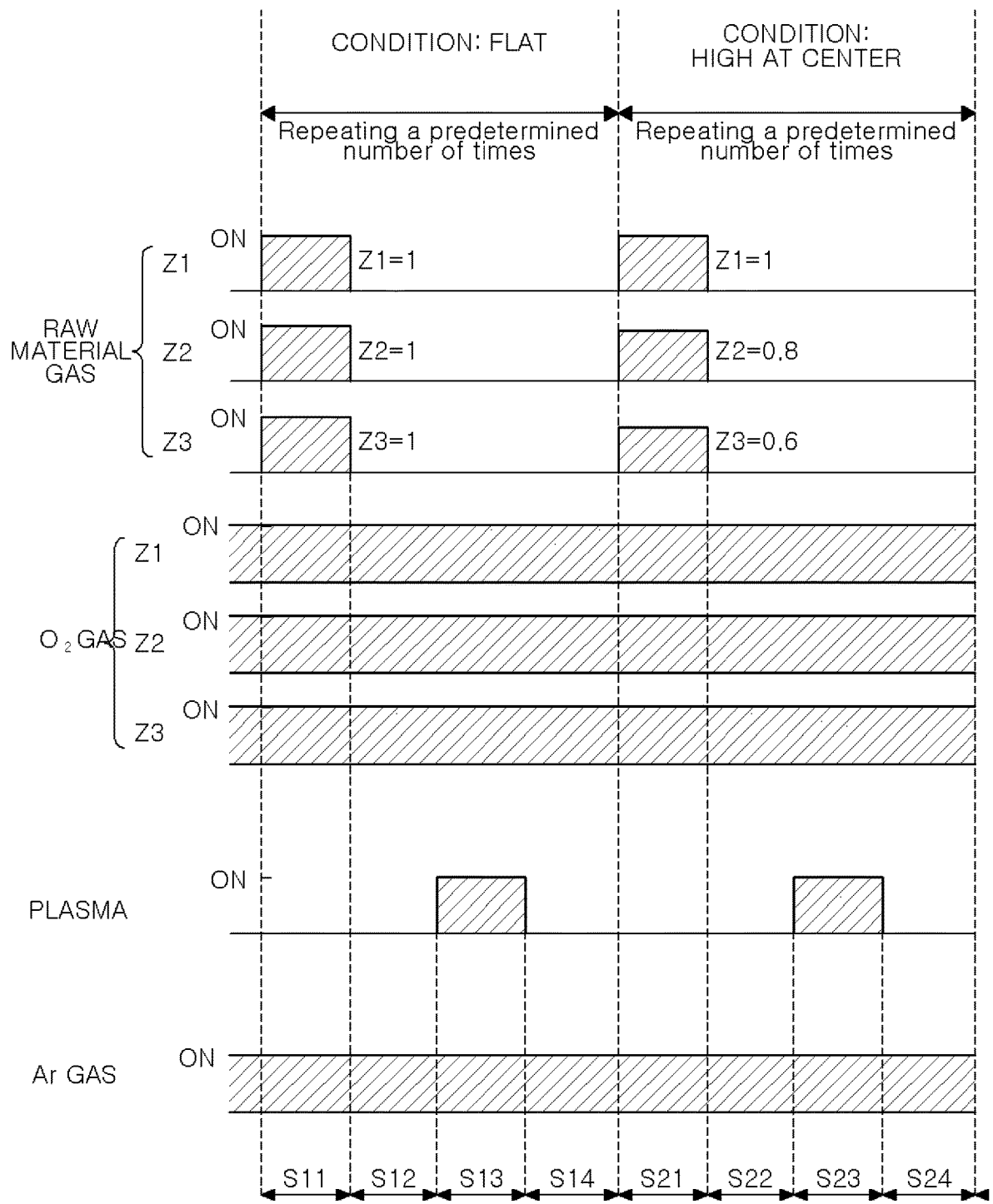
FIG. 13 is a chart showing still another example of the film forming method performed by the film forming apparatus.

In this example, the case in which the raw material gas supply amount is controlled by changing a partial pressure to obtain the film thickness profile "high at center" will be described with reference to the chart of FIG. 13. In this example, $O_2$ gas and Ar gas are constantly supplied during the first step and the second step and the raw material gas and the $O_2$ gas react with each other by a plasma generated by a plasma generation unit. Therefore, the steps S13 and S23 become a reaction period in which the raw material gas and the $O_2$ gas react with each other.

The control unit is configured to output a control signal such that a relationship combination pattern of the supply amount of the raw material gas per unit time and per unit area of the shower plate 42 in the first to the third partition region Z1 to Z3 becomes different in the first step and the second step. Therefore, in the second step, in order to obtain the film thickness profile "high at center" in the step S21 of supplying the raw material gas, the raw material gas supply amount is set to be greatest in the first partition region Z1 and to be gradually decreased toward the periphery.

The raw material gas supply unit 50 is the same as the raw material gas supply unit in the above-described embodiment in that a gaseous mixture of the raw material gas and Ar gas as the carrier gas is supplied during a raw material gas supply period and the supply of Ar gas is continued during a period other than the raw material gas supply period. In this example, $O_2$ gas is uniformly supplied to the entire surface of the wafer W in the first step and the second step. In the second step, the raw material gas supply amount in the first to the third partition regions Z1 to Z3 is controlled. Therefore, an $SiO_2$ film having a film thickness profile "high at center" can be formed.

The present disclosure can be applied to a film forming apparatus for performing thermal ALD in which a raw material gas and a reactant gas react with each other by heat energy in forming a thin film on a substrate by repeating a cycle of alternately supplying the raw material gas and the reactant gas multiple times. As for the film forming apparatus for performing thermal ALD, it is possible to use a film forming apparatus having the same configuration as that of the film forming apparatus 1 shown in FIG. 1 except that the plasma generation unit for converting a reactant gas into a plasma is not provided. The case in which the plasma generation unit is not provided means a case in which the high frequency power supply is not connected to the shower plate 42 and the electrode plate is not provided at the mounting portion 31, for example.

In the case of performing thermal ALD, the substrate is constantly heated by, e.g., a heating unit (not shown) provided at the mounting portion 31 to a temperature at which the raw material gas and the reactant gas react with each other and a thin film is formed by repeating a cycle of alternately discharging the raw material gas and the reactant gas from the gas injection unit 4. As described above, the control unit 10 outputs a control signal such that at least one of the supply amount of the raw material gas and that of the reactant gas per unit time and per unit area of the shower plate 42 becomes different in at least two partition regions among the partition regions Z1 to Z3. Accordingly, a thin film having a desired film thickness profile is formed.

In the present disclosure, as for the raw material gas, it is possible to use a gas containing any elements of a non-metal and a metal used for semiconductor devices, such as silicon, titanium, aluminum, hafnium or the like. As for the reactant gas, it is possible to use any gas that can cause reaction, such as oxidation, reduction, nitriding, carbonization, sulfurization or the like, with the raw material gas adsorbed onto the substrate. As for the oxidizing gas, it is possible to use $O_2$, $O_3$ or $H_2O_2$. As for a reduction gas, it is possible to use $H_2$ or CO. As for a nitriding gas, it is possible to use $NH_3$ or $N_2H_4$. As for a carbonization gas, it is possible to use $CO_2$ or CO. As for a sulfiding gas, it is possible to use $H_2S$, $SO_2$ or the like.

(Evaluation Test 1)

Evaluation tests in the present disclosure will be described. In an evaluation test 1, in the film forming apparatus 1 including the gas injection unit 4 shown in FIG. 1, an adsorption amount of the raw material gas was simulated in the case of supplying the raw material gas for 0.05 second at a pressure of 2 Torr or less while varying the supply amount ratio of the raw material gas between the first to the third partition region Z1 to Z3 depending on a desired film thickness profile.

When a desired film thickness profile was a "high at center", a supply amount ratio of the raw material gas was set to Z1=1, Z2=0.8 and Z3=0.6 so that the supply amount in the first partition region Z1 corresponding to the central portion of the wafer becomes greatest.

When a desired film thickness profile was a "high in the middle", a supply amount ratio of the raw material gas was set to Z1=0.6, Z2=1 and Z3=0.4 so that the supply amount in the second partition region Z2 corresponding to the intermediate portion of the wafer becomes greatest.

When a desired film thickness profile was a "high at periphery", a supply amount ratio of the raw material gas was set to Z1=0.5, Z2=0.75 and Z3=1 so that the supply amount in the third partition region Z3 corresponding to the peripheral portion of the wafer becomes greatest.

Figure 14:
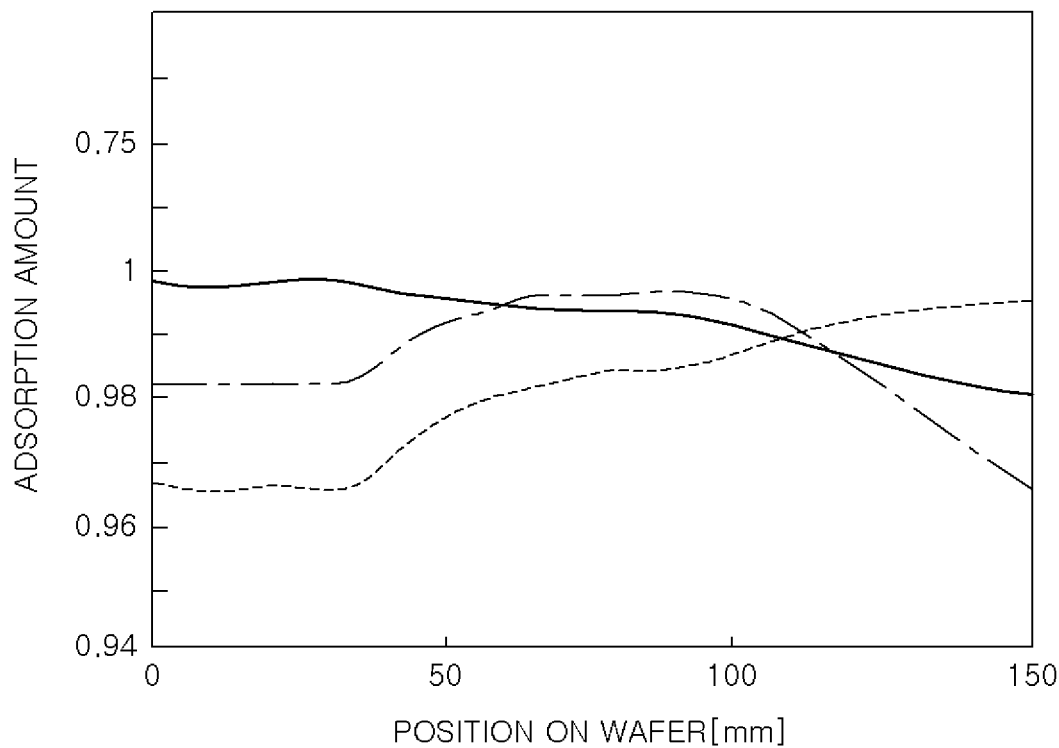
FIGS. 14 to 18 are graphs describing characteristics of results of evaluation tests.

The results thereof are shown in FIG. 14. In FIG. 14, the "high at center" is indicated by a solid line; the "high in the middle" is indicated by a dashed-dotted line; and the "high at periphery" is indicated by a dotted line. In FIG. 14, the vertical axis represents an adsorption amount of the raw material gas and the horizontal axis represents a position in the diametrical direction of the wafer W. 0 mm indicates the center of the wafer. 150 mm indicates the outer periphery of the wafer. As a result, it has been confirmed that, in the case of setting the raw material gas supply amount to be different in the first to the third partition region Z1 to Z3, the adsorption amount of the raw material gas onto the regions of the wafer W which correspond to the partition regions Z1 to Z3 is changed and the adsorption amount on the region of the wafer W which corresponds to the partition region where the supply amount is large. It has been confirmed that since the adsorption amount of the raw material gas affects the film thickness, the film thickness profile can be controlled by controlling the raw material gas supply amount (supply amount ratio).

(Evaluation Test 2)

Figure 12:
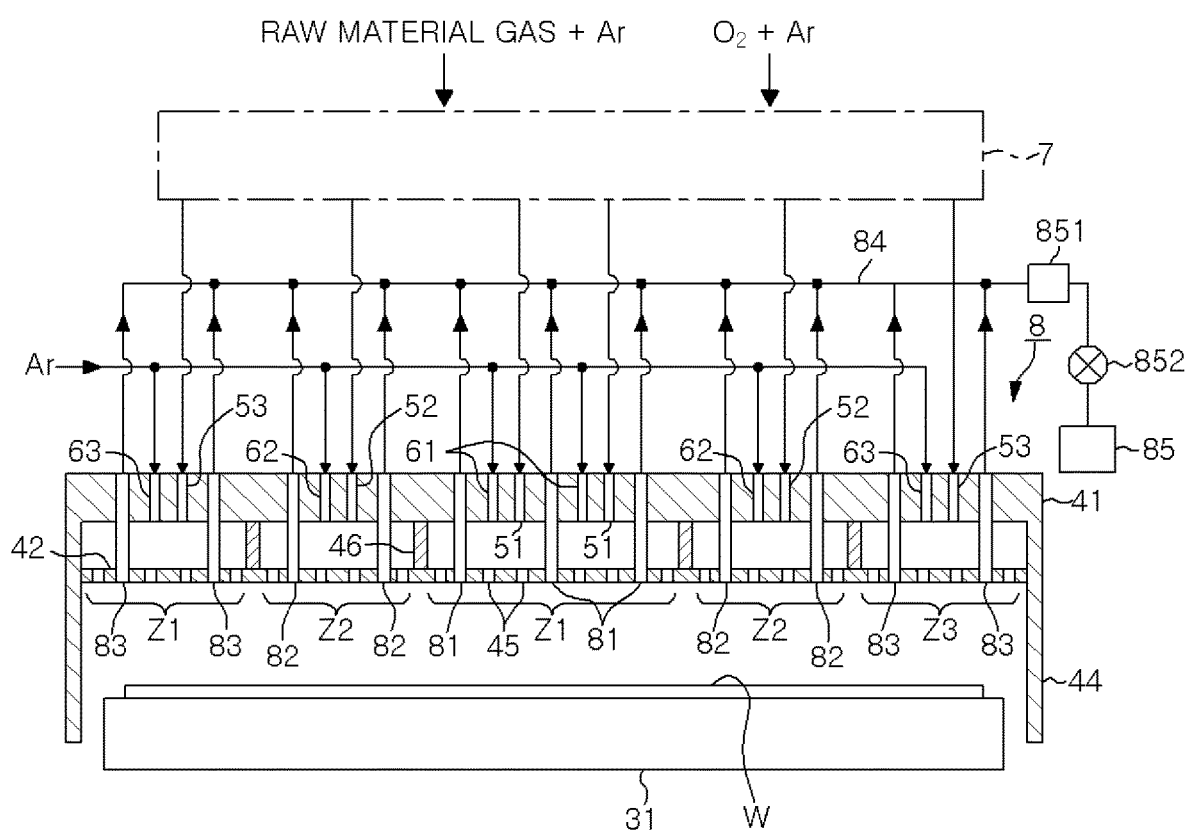
FIG. 12 is a vertical cross sectional view showing a part of another film forming apparatus.
Figure 15:
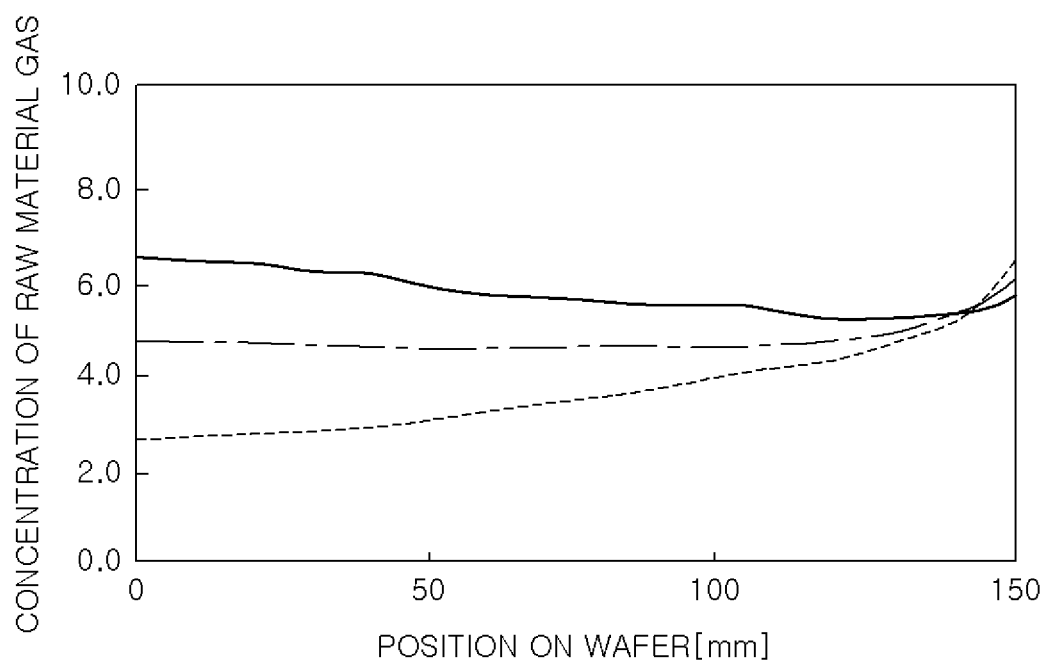

In an evaluation test 2, in a film forming apparatus including the gas injection unit 8 shown in FIG. 12, the adsorption amount of the raw material gas in the case of varying the supply amount ratio of the raw material gas between the first to the third partition region Z1 to Z3 under the same conditions as those of the evaluation test 1 was simulated. The result thereof is shown in FIG. 15. In FIG. 15, the "high at center" is indicated by a solid line; the "high in the middle" is indicated by a dashed-dotted line; and the "high at periphery" is indicated by a dotted line. In FIG. 15, the vertical axis represents the concentration (arbitrary unit) of the raw material gas supplied onto the wafer surface and the horizontal axis represents a position in the diametrical direction of the wafer W. 0 mm indicates the center of the wafer. 150 mm indicates the outer periphery of the wafer. As a result, the concentration of the raw material gas supplied onto the wafer surface is changed by changing the raw material gas supply amount. In the film forming apparatus including the gas injection unit 8, the film thickness profile can be controlled by adjusting the raw material gas supply amount (supply amount ratio) in the first to the third partition region Z1 to Z3.

(Evaluation Test 3)

In an evaluation test 3, in the film forming apparatus 1 including the gas injection unit 4 shown in FIG. 1, the adsorption amount of the raw material gas in the case of supplying the raw material gas for 0.05 second at a pressure of 2 Torr or less while varying the supply period of the raw material gas in the first to the third partition region Z1 to Z3 depending on a desired film thickness profile was simulated.

When a desired film thickness profile was a "high at center", a supply amount ratio of the raw material gas was set to Z1=0.05, Z2=0.04 and Z3=0.03 so that the supply amount in the first partition region Z1 corresponding to the central portion of the wafer becomes greatest.

When a desired film thickness profile was a "high in the middle" shape, a supply amount ratio of the raw material gas was set to Z1=0.03, Z2=0.05 and Z3=0.01 so that the supply amount in the second partition region Z2 corresponding to the intermediate portion of the wafer becomes greatest.

When a desired film thickness profile was a "high at periphery" shape, a supply amount ratio of the raw material gas was set to Z1=0.03, Z2=0.04 and Z3=0.05 so that the supply amount in the third partition region Z3 corresponding to the peripheral portion of the wafer becomes greatest.

Figure 16:
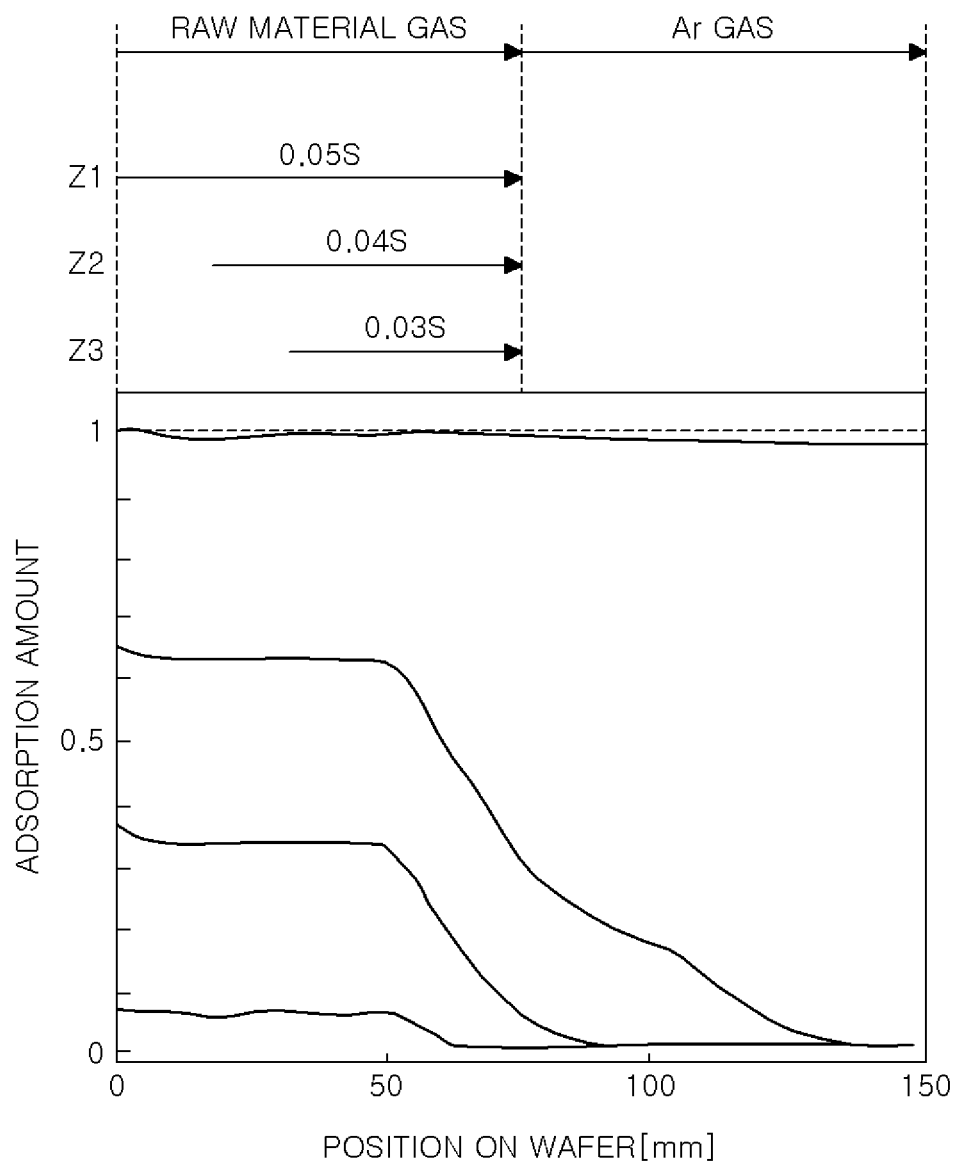
Figure 17:
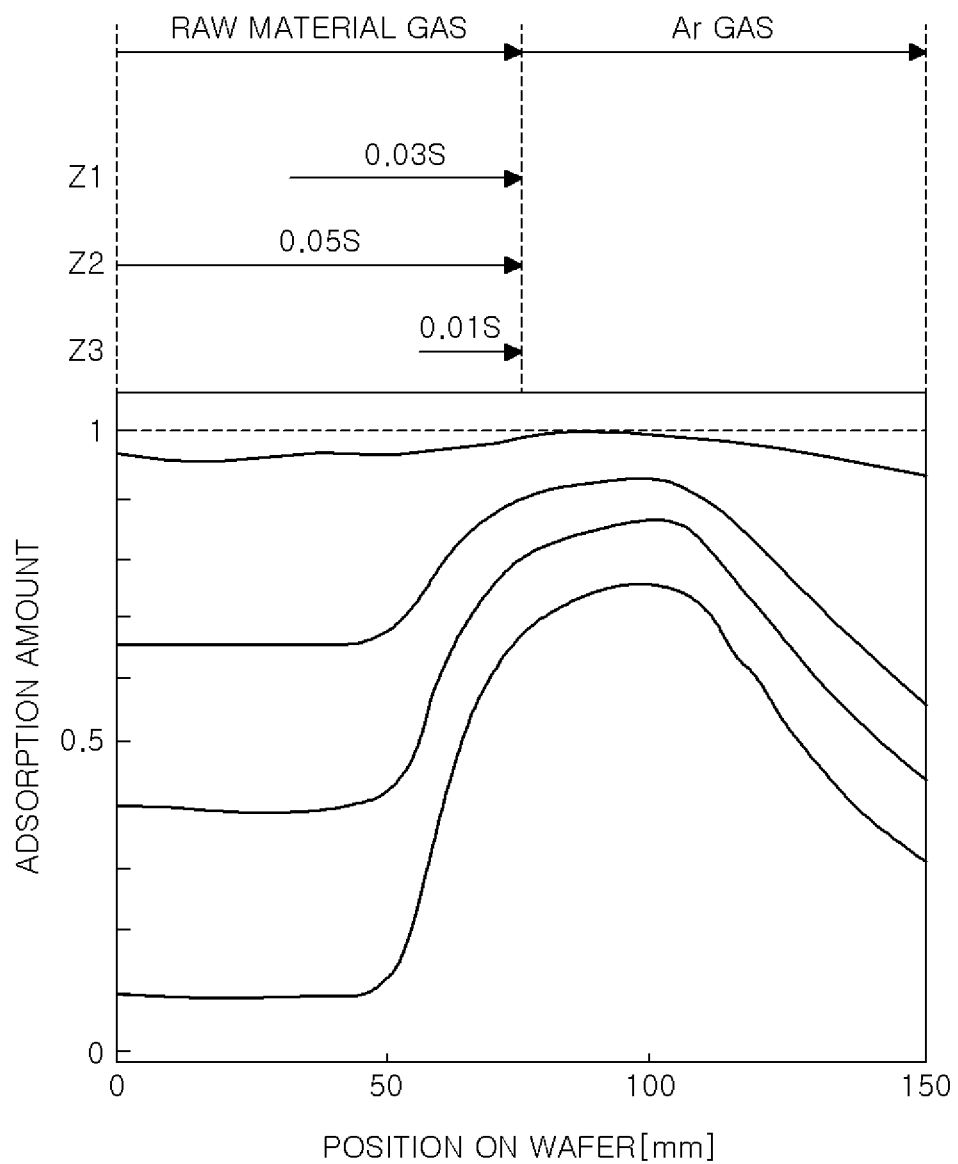
Figure 18:
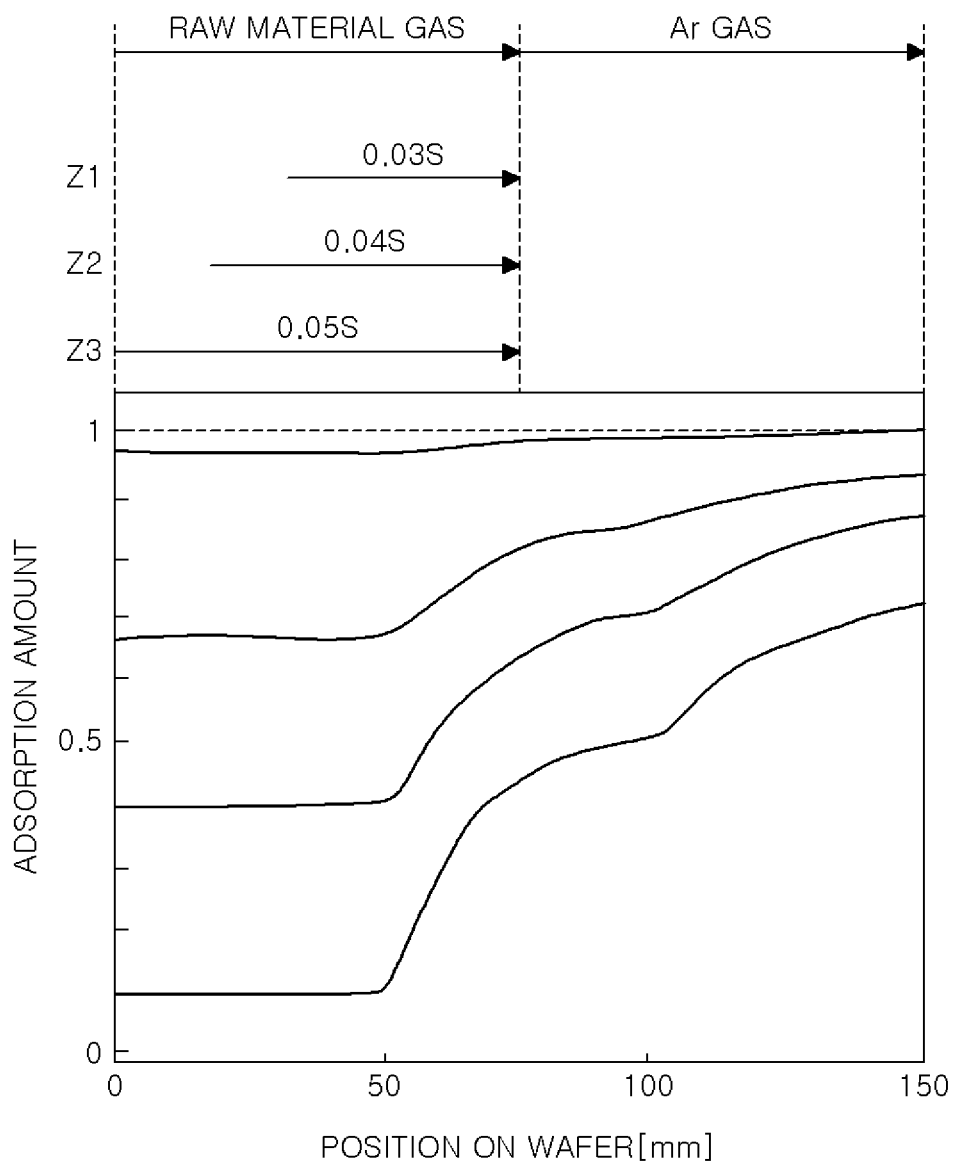

The result thereof is shown in FIGS. 16 to 18 showing the "high at center", the "high in the middle" and the "high at periphery", respectively. In FIGS. 16 to 18, the vertical axis represents an adsorption amount of the raw material gas and the horizontal axis represents a position in a diametrical direction of the wafer W. 0 mm indicates the center of the wafer. 150 mm indicates the outer periphery of the wafer. FIGS. 16 to 18 show temporal changes of the adsorption amount. Time elapses in the order from the lowermost line to the uppermost line. The uppermost line corresponds to a film surface.

Referring to FIGS. 16 to 18, when the raw material gas supply time is different in the first to the third partition regions Z1 to Z3, the adsorption amount of the raw material gas in the regions of the wafer W which correspond to the partition regions Z1 to Z3 is changed and the adsorption amount in the region of the wafer W which corresponds to the partition region where the supply amount is large is increased. Therefore, the film thickness profile can be controlled by setting the raw material gas supply time to be different in the first to the third partition region Z1 to Z3.

While the disclosure has been shown and described with respect to the embodiments, it will be understood by those skilled in the art that various changes and modifications may be made without departing from the scope of the disclosure as defined in the following claims.

What is claimed is:

1. A film forming apparatus for forming a thin film having a predetermined film thickness on a substrate by repeating a cycle of forming a monomolecular layer by supplying a raw material gas and a reactant gas that reacts with the raw material gas multiple times under a vacuum atmosphere, the apparatus comprising:

a processing chamber in which a mounting portion for mounting thereon a substrate is provided and a vacuum atmosphere is formed;

a gas injection unit including a shower plate having a plurality of gas injection holes disposed to face the mounting portion, and a plurality of partition regions through which gases are separately injected and which are defined by dividing an arrangement region of the gas injection holes into a plurality of concentric regions in a diametrical direction of the substrate;

a raw material gas supply unit configured to supply a raw material gas to the gas injection unit;

a reactant gas supply unit configured to supply a reactant gas to the gas injection unit;

a plasma generation unit configured to convert the reactant gas into a plasma; and a control unit configured to output a control signal such that at least one of a supply amount of the raw material gas per unit time in a raw material gas supply period in the cycle and per unit area of the shower plate, and a supply amount of the reactant gas per unit time in a reaction period of the raw material gas and the reactant gas in the cycle and per unit area of the shower plate, becomes different in at least two partition regions among the plurality of partition regions, wherein the control unit outputs the control signal such that the raw material gas and the reactant gas are alternately injected from the gas injection unit and the injected reactant gas is turned into a plasma by the plasma generation unit, wherein the thin film is formed on the substrate through a first step and a second step, and wherein the control unit outputs the control signal such that at least one of a ratio of the supply amount of the raw material gas per unit time in the raw material gas supply period and per unit area of the shower plate between the plurality of partition regions, and a ratio of the supply amount of the reactant gas per unit time in the reaction period of the raw material gas and the reactant gas and per unit area of the shower plate between the plurality of partition regions, becomes different in the first step and the second step.

2. The film forming apparatus of claim 1, wherein the raw material gas and the reactant gas are injected through the same gas injection holes.

3. The film forming apparatus of claim 1, further comprising: a heating unit configured to heat the raw material gas and the reactant gas.

4. The film forming apparatus of claim 1, wherein the raw material gas contains any one of silicon, titanium, aluminum and hafnium and the reactant gas is an oxidizing gas or a nitriding gas.

5. The film forming apparatus of claim 1, wherein the raw material gas supply unit is configured to supply a gaseous mixture of a carrier gas and the raw material gas during the raw material gas supply period and continue the supply of the carrier gas during a period other than the raw material gas supply period, and the reactant gas supply unit is configured to supply a gaseous mixture of the carrier gas and the reactant gas during the reaction period of the raw material gas and the reactant gas and continue the supply of the carrier gas during a period other than the reaction period.

6. A film forming apparatus for forming a thin film having a predetermined film thickness on a substrate by repeating a cycle of forming a monomolecular layer by supplying a raw material gas and a reactant gas that reacts with the raw material gas multiple times under a vacuum atmosphere, the apparatus comprising:

a processing chamber in which a mounting portion for mounting thereon a substrate is provided and a vacuum atmosphere is formed;

a gas injection unit including a shower plate having a plurality of gas injection holes disposed to face the mounting portion, and a plurality of partition regions through which gases are separately injected and which are defined by dividing an arrangement region of the gas injection holes into a plurality of concentric regions in a diametrical direction of the substrate;

a raw material gas supply unit configured to supply a raw material gas to the gas injection unit;

a reactant gas supply unit configured to supply a reactant gas to the gas injection unit;

a plasma generation unit configured to convert the reactant gas into a plasma; and a control unit configured to output a control signal such that at least one of a supply amount of the raw material gas per unit time in a raw material gas supply period in the cycle and per unit area of the shower plate, and a supply amount of the reactant gas per unit time in a reaction period of the raw material gas and the reactant gas in the cycle and per unit area of the shower plate, becomes different in at least two partition regions among the plurality of partition regions, wherein the control unit outputs the control signal such that the reactant gas is injected from the gas injection unit during the cycle of forming the monomolecular layer and the supply amount of the raw material gas per unit time in the raw material gas supply period in the cycle and per unit area of the shower plate become different in at least two partition regions among the plurality of partition regions, wherein the thin film is formed on the substrate through a first step and a second step, and wherein the control unit outputs a control signal such that a ratio of the supply amount of the raw material gas per unit time in the raw material gas supply period and per unit area of the shower plate between the plurality of partition regions becomes different in the first step and the second step.

7. A film forming apparatus for forming a thin film having a predetermined film thickness on a substrate by repeating a cycle of forming a monomolecular layer by supplying a raw material gas and a reactant gas that reacts with the raw material gas multiple times under a vacuum atmosphere, the apparatus comprising:

a processing chamber in which a mounting portion for mounting thereon a substrate is provided and a vacuum atmosphere is formed;

a gas injection unit including a shower plate having a plurality of gas injection holes disposed to face the mounting portion, and a plurality of partition regions through which gases are separately injected and which are defined by dividing an arrangement region of the gas injection holes into a plurality of concentric regions in a diametrical direction of the substrate;

a raw material gas supply unit configured to supply a raw material gas to the gas injection unit;

a reactant gas supply unit configured to supply a reactant gas to the gas injection unit;

a plasma generation unit configured to convert the reactant gas into a plasma; and a control unit configured to output a control signal such that at least one of a supply amount of the raw material gas per unit time in a raw material gas supply period in the cycle and per unit area of the shower plate, and a supply amount of the reactant gas per unit time in a reaction period of the raw material gas and the reactant gas in the cycle and per unit area of the shower plate, becomes different in at least two partition regions among the plurality of partition regions, wherein the control unit outputs the control signal such that the raw material gas and the reactant gas are alternately injected from the gas injection unit and the injected reactant gas is turned into a plasma by the plasma generation unit, wherein the thin film is formed on the substrate through a first step and a second step, and wherein the control unit outputs a control signal such that at least one of a relationship combination pattern of the supply amount of the raw material gas per unit time and per unit area of the shower plate in the plurality of partition regions and a relationship combination pattern of the supply amount of the reactant gas per unit time and per unit area of the shower plate in the plurality of partition regions becomes different in the first step and the second step.

8. A film forming apparatus for forming a thin film having a predetermined film thickness on a substrate by repeating a cycle of forming a monomolecular layer by supplying a raw material gas and a reactant gas that reacts with the raw material gas multiple times under a vacuum atmosphere, the apparatus comprising:
 a processing chamber in which a mounting portion for mounting thereon a substrate is provided and a vacuum atmosphere is formed;
 a gas injection unit including a shower plate having a plurality of gas injection holes disposed to face the mounting portion, and a plurality of partition regions through which gases are separately injected and which are defined by dividing an arrangement region of the gas injection holes into a plurality of concentric regions in a diametrical direction of the substrate;
 a raw material gas supply unit configured to supply a raw material gas to the gas injection unit;
 a reactant gas supply unit configured to supply a reactant gas to the gas injection unit;
 a plasma generation unit configured to convert the reactant gas into a plasma; and
 a control unit configured to output a control signal such that at least one of a supply amount of the raw material gas per unit time in a raw material gas supply period in the cycle and per unit area of the shower plate, and a supply amount of the reactant gas per unit time in a reaction period of the raw material gas and the reactant gas in the cycle and per unit area of the shower plate, becomes different in at least two partition regions among the plurality of partition regions,
 wherein the control unit outputs the control signal such that the reactant gas is injected from the gas injection unit during the cycle of forming the monomolecular layer and the supply amount of the raw material gas per unit time in the raw material gas supply period in the cycle and per unit area of the shower plate become different in at least two partition regions among the plurality of partition regions,
 wherein the thin film is formed on the substrate through a first step and a second step, and
 wherein the control unit outputs a control signal such that a relationship combination pattern of the supply amount of the raw material gas per unit time and per unit area of the shower plate in the plurality of partition regions becomes different in the first step and the second step.

9. The film forming apparatus of claim 6, wherein the raw material gas and the reactant gas are injected through the same gas injection holes.

10. The film forming apparatus of claim 6, further comprising: a heating unit configured to heat the raw material gas and the reactant gas.

11. The film forming apparatus of claim 6, wherein the raw material gas contains any one of silicon, titanium, aluminum and hafnium and the reactant gas is an oxidizing gas or a nitriding gas.

12. The film forming apparatus of claim 6, wherein the raw material gas supply unit is configured to supply a gaseous mixture of the carrier gas and the raw material gas during the raw material gas supply period and continue the supply of the carrier gas during a period other than the raw material gas supply period.

13. The film forming apparatus of claim 7, wherein the raw material gas and the reactant gas are injected through the same gas injection holes.

14. The film forming apparatus of claim 7, further comprising: a heating unit configured to heat the raw material gas and the reactant gas.

15. The film forming apparatus of claim 7, wherein the raw material gas contains any one of silicon, titanium, aluminum and hafnium and the reactant gas is an oxidizing gas or a nitriding gas.

16. The film forming apparatus of claim 7, wherein the raw material gas supply unit is configured to supply a gaseous mixture of a carrier gas and the raw material gas during the raw material gas supply period and continue the supply of the carrier gas during a period other than the raw material gas supply period, and
 the reactant gas supply unit is configured to supply a gaseous mixture of the carrier gas and the reactant gas during the reaction period of the raw material gas and the reactant gas and continue the supply of the carrier gas during a period other than the reaction period.

17. The film forming apparatus of claim 8, wherein the raw material gas and the reactant gas are injected through the same gas injection holes.

18. The film forming apparatus of claim 8, further comprising: a heating unit configured to heat the raw material gas and the reactant gas.

19. The film forming apparatus of claim 8, wherein the raw material gas contains any one of silicon, titanium, aluminum and hafnium and the reactant gas is an oxidizing gas or a nitriding gas.

20. The film forming apparatus of claim 8, wherein the raw material gas supply unit is configured to supply a gaseous mixture of the carrier gas and the raw material gas during the raw material gas supply period and continue the supply of the carrier gas during a period other than the raw material gas supply period.

* * * * *